United States Patent
Fujisaki

Patent Number: 6,006,349
Date of Patent: *Dec. 21, 1999

[54] HIGH SPEED PATTERN GENERATING METHOD AND HIGH SPEED PATTERN GENERATOR USING THE METHOD

[75] Inventor: Kenichi Fujisaki, Gyoda, Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/809,632

[22] PCT Filed: Jul. 26, 1996

[86] PCT No.: PCT/JP96/02104

§ 371 Date: Mar. 26, 1997

§ 102(e) Date: Mar. 26, 1997

[87] PCT Pub. No.: WO97/05499

PCT Pub. Date: Feb. 13, 1997

[30] Foreign Application Priority Data

Jul. 26, 1995 [JP] Japan .................................. 7-190513
Jul. 26, 1995 [JP] Japan .................................. 7-190514

[51] Int. Cl.⁶ .................................................. G01R 31/28
[52] U.S. Cl. ........................................... 714/738; 714/743
[58] Field of Search .................................... 714/738, 739, 714/742, 743, 744, 718, 724, 728, 730, 731, 733, 734; 375/362; 324/73.1

[56] References Cited

U.S. PATENT DOCUMENTS

| | | | |
|---|---|---|---|
| 4,389,723 | 6/1983 | Nigorikawa et al. | 371/27.1 |
| 4,807,229 | 2/1989 | Tada | 371/27.1 |
| 4,862,460 | 8/1989 | Yamaguchi | 371/27.1 |
| 4,905,183 | 2/1990 | Kawaguchi et al. | 371/27.1 X |
| 4,959,832 | 9/1990 | Bardell et al. | 371/27.1 |
| 5,224,125 | 6/1993 | Wong et al. | 375/328 |
| 5,432,797 | 7/1995 | Takano | 371/27.1 |

FOREIGN PATENT DOCUMENTS

4-14901  1/1992  Japan .
7-12983  3/1995  Japan .

*Primary Examiner*—Hoa T. Nguyen
*Attorney, Agent, or Firm*—Staas & Halsey, LLP

[57] ABSTRACT

A high speed pattern generating method by which a pattern signal having a speed higher than conventional speed can be generated using a sequence control part operating at a speed equivalent to a conventional speed and a high speed pattern generator for materializing the method are provided. A high speed pattern signal having a speed multiple of the number of multiplexing against an operation speed of the sequence control part is generated by generating multi-phase sub patterns from a plurality of sub pattern generating parts and by taking out for multiplexing the multi-phase sub patterns one phase by one phase by a multiplexing circuit. Further, an instruction memory of a pattern generator is uniquely arranged to materialize the high speed pattern generating method.

22 Claims, 21 Drawing Sheets

| | 10 | 11 | SUB PATTERN GENERATING INSTRUCTION | | | | |
|---|---|---|---|---|---|---|---|
| STEP | PATTERN GEN INSTR | X ADDRESS PATTERN | 12A 113B$_1$ | 12B 113B$_2$ | 12C 113B$_3$ | 12D 113B$_4$ | SUB PTN |
| 1 | X < 0 | X = 0 | X < 0 (X=0) | | | | |
| 2 | X < X+1 | X = 1 | | X < 1 (X=1) | | | ~A |
| 3 | X < X+1 | X = 2 | | | X < 2 (X=2) | | |
| 4 | X < X+1 | X = 3 | | | | X < 3 (X=3) | |
| 5 | X < X+1 | X = 4 | X < X+4 (X=4) | | | | |
| 6 | X < X+1 | X = 5 | | X < X+4 (X=5) | | | A~B |
| 7 | X < X+1 | X = 6 | | | X < X+4 (X=6) | | |
| 8 | X < X+1 | X = 7 | | | | X < X+4 (X=7) | |
| 9 | X < X+1 | X = 8 | X < X+4 (X=8) | | | | |
| 10 | X < X+1 | X = 9 | | X < X+4 (X=9) | | | B~B |
| 11 | X < X+1 | X = 10 | | | X < X+4 (X=10) | | |
| 12 | X < X+1 | X = 11 | | | | X < X+4 (X=11) | |
| 13 | X < X+1 | X = 10 | X < X+2 (X=10) | | | | |
| 14 | X < X+1 | X = 9 | | X < X+0 (X=9) | | | B~C |
| 15 | X < X+1 | X = 8 | | | X < X−2 (X=8) | | |
| 16 | X < X+1 | X = 7 | | | | X < X−4 (X=7) | |
| 17 | X < X+1 | X = 8 | X < X−2 (X=8) | | | | |
| 18 | X < X+1 | X = 9 | | X < X−0 (X=9) | | | C~B |
| 19 | X < X+1 | X = 10 | | | X < X+2 (X=10) | | |
| 20 | X < X+1 | X = 11 | | | | X < X+4 (X=11) | |
| 21 | X < X+1 | X = 12 | X < X+4 (X=12) | | | | |
| 22 | X < X+1 | X = 13 | | X < X+4 (X=13) | | | B~B |
| 23 | X < X+1 | X = 14 | | | X < X+4 (X=14) | | |
| 24 | X < X+1 | X = 15 | | | | X < X+4 (X=15) | |
| 25 | X < X+1 | X = 14 | X < X+2 (X=14) | | | | |
| 26 | X < X+1 | X = 13 | | X < X+2 (X=13) | | | B~C |
| 27 | X < X+1 | X = 12 | | | X < X−2 (X=12) | | |
| 28 | X < X+1 | X = 11 | | | | X < X−4 (X=11) | |

FIG. 4

| CYCLE | P C | SEQUENCE CONT INSTRUCTION | PATTERN | SUB PATTERN |
|---|---|---|---|---|
| 1 | # 0 | NOP | A | ~ A |
| 2 | # 1 | LOOP 1　LB1 | B | A ~ B |
| 3 | # 1 | LOOP 1　LB1 | B | B ~ B |
| 4 | # 2 | LOOP 2　LB1 | C | B ~ C |
| 5 | # 1 | LOOP 1　LB1 | B | C ~ B |
| 6 | # 1 | LOOP 1　LB1 | B | B ~ B |
| 7 | # 2 | LOOP 2　LB1 | C | B ~ C |
| 8 | # 1 | LOOP 1　LB1 | B | C ~ B |

FIG. 7

| CYCLE | PC | SEQUENCE CONT INSTRUCTION | IM2A | SUB PATTERN |
|---|---|---|---|---|
| 1 | #0 | NOP | #0 | ~ A |
| 2 | #1 | LOOP1  LB1 | #1 | A ~ B |
| 3 | #1 | LOOP1  LB1 | #1 + #400 | B ~ B |
| 4 | #1 | LOOP1  LB1 | #1 + #400 | B ~ B |
| 5 | #1 | LOOP1  LB1 | #1 + #400 | B ~ B |
| 6 | #2 | LOOP2  LB1 | #2 | B ~ C |
| 7 | #1 | LOOP1  LB1 | #2 + #400 | C ~ B |
| 8 | #1 | LOOP1  LB1 | #1 + #400 | B ~ B |
| 9 | #1 | LOOP1  LB1 | #1 + #400 | B ~ B |
| 10 | #1 | LOOP1  LB1 | #1 + #400 | B ~ B |
| 11 | #2 | LOOP2  LB1 | #2 | B ~ C |
| 12 | #1 | LOOP1  LB1 | #2 + #400 | C ~ B |
| 13 | #1 | LOOP1  LB1 | #1 + #400 | B ~ B |
| 14 | #1 | LOOP1  LB1 | #1 + #400 | B ~ B |
| 15 | #1 | LOOP1  LB1 | #1 + #400 | B ~ B |
| 16 | #2 | LOOP2  LB1 | #2 | B ~ C |
| 17 | #3 | NOP | #3 | C ~ D |

FIG. 9

| CYCLE | PC | SEQUENCE CONTROL INSTRUCTION | IM 2A | SUB PATTERN |
|---|---|---|---|---|
| 1 | #0 | NOP | #0 | ~ A |
| 2 | #1 | LOOP1   LB1 | #1 | A ~ B |
| 3 | #1 | LOOP1   LB1 | #3FF | B ~ B |
| 4 | #1 | LOOP1   LB1 | #3FF | B ~ B |
| 5 | #1 | LOOP1   LB1 | #3FF | B ~ B |
| 6 | #2 | LOOP2   LB1 | #2 | B ~ C |
| 7 | #1 | LOOP1   LB1 | #3FE | C ~ B |
| 8 | #1 | LOOP1   LB1 | #3FF | B ~ B |
| 9 | #1 | LOOP1   LB1 | #3FF | B ~ B |
| 10 | #1 | LOOP1   LB1 | #3FF | B ~ B |
| 11 | #2 | LOOP2   LB1 | #2 | B ~ C |
| 12 | #1 | LOOP1   LB1 | #3 | C ~ B |
| 13 | #1 | LOOP1   LB1 | #3FE | B ~ B |
| 14 | #1 | LOOP1   LB1 | #3FF | B ~ B |
| 15 | #1 | LOOP1   LB1 | #3FF | B ~ B |
| 16 | #2 | LOOP2   LB1 | #2 | B ~ C |
| 17 | #3 | NOP | #3 | C ~ D |

FIG. 14

| STEP | PATTERN GENERATING INSTRUCTION | MAIN PATTERN | SUB PATTERN | SUB PATTERN | SUB PATTERN |
| --- | --- | --- | --- | --- | --- |
| 1 | X < 0 (1, 2, 3) | X = 0 | X = 0+1 | X = 0+2 | X = 0+3 |
| 2 | X < X+4 (1, 2, 3) | X = 4 | X = 4+1 | X = 4+2 | X = 4+3 |
| 3 | X < X+4 (1, 2, 3) | X = 8 | X = 8+1 | X = 8+2 | X = 8+3 |
| 4 | X < X+4 (1, 2, 3) | X = 12 | X = 12+1 | X = 12+2 | X = 12+3 |
| 5 | X < X+4 (1, 2, 3) | X = 16 | X = 16+1 | X = 16+2 | X = 16+3 |
| 6 | X < X+4 (1, 2, 3) | X = 20 | X = 20+1 | X = 20+2 | X = 20+3 |
| 7 | X < X+4 (1, 2, 3) | X = 24 | X = 24+1 | X = 24+2 | X = 24+3 |
| 8 | X < X+4 (1, 2, 3) | X = 28 | X = 28+1 | X = 28+2 | X = 28+3 |
| 9 | X < X+4 (1, 2, 3) | X = 32 | X = 32+1 | X = 32+2 | X = 32+3 |
| 10 | X < X+4 (1, 2, 3) | X = 36 | X = 36+1 | X = 36+2 | X = 36+3 |
| 11 | X < X+4 (1, 2, 3) | X = 40 | X = 40+1 | X = 40+2 | X = 40+3 |

FIG. 18

HIGH SPEED PATTERN GENERATING METHOD AND HIGH SPEED PATTERN GENERATOR USING THE METHOD

TECHNICAL FIELD

The present invention relates to a high speed pattern generating method for generating test pattern signals at high speed and a high speed pattern generator using this method which are useful in application thereof to a semiconductor device testing apparatus or the like, the semiconductor device testing apparatus being arranged to test a semiconductor device formed as a semiconductor integrated circuit (IC), for instance, an IC memory, as to whether it is conformable (pass) article or unconformable (failure) article.

BACKGROUND ART

FIG. 1 shows an example of a semiconductor device testing apparatus conventionally used for testing a semiconductor device such as an IC memory. As shown in the drawing, this semiconductor device testing apparatus includes a pattern generator 100, a data selector 200, a device under test, for example, an IC 300, and a logical comparator 400. The pattern generator 100 comprises a sequence control part 110 and a pattern generating part 120.

The sequence control part 110 comprises, as shown in FIG. 2, a program counter controller 111, a program counter 112, an instruction memory 113, a loop counter 114 and an initial value storing register 115. The instruction memory 113 comprises a sequence control instruction storage area 113A and a pattern generating instruction storage area 113B, and these storage areas 113A and 113B are accessed by an address signal supplied from the program counter 112. When the sequence control instruction storage area 113A is accessed, a sequence control instruction is read out from the sequence control instruction storage area 113A and then this sequence control instruction is supplied to the program counter controller 111 to be decoded therein and an address to be accessed next is determined. This address is sent to the program counter 112 from the program counter controller 111 and the program counter 112 supplies an address signal for accessing the determined address to the instruction memory 113. Then, a sequence control instruction to be next executed is read out from the instruction memory 113. In such a way, every time one of the sequence control instructions is sequentially read out from the instruction memory 113, the program counter controller 111 determines an address to be next accessed in accordance with a control instruction written in that sequence control instruction. The above operation is repeated so that a pattern generating instruction is read out from the pattern generating instruction storage area 113B.

One of the reasons why a system for reading out a pattern generating instruction while determining an address to be next accessed in accordance with a sequence control instruction is used as described above is that in case of using a system for programming pattern generating instructions one step by one step to generate pattern signals, for example, there occurs a trouble in the system that the program becomes extensive and lengthy and hence a large amount of work and time are required for the programming.

Therefore, a programming method for generating a predetermined test pattern a predetermined number of times using a loop instruction is generally employed. In this method, at starting time of a pattern generation, the number of loop times etc. are stored in the initial value storing register 115 for each loop instruction and when a loop instruction is executed, the number of loop times is counted by the loop counter 114. When the loop instruction is executed a predetermined number of times, the execution of the loop instruction is terminated and then the process moves to an execution of the next loop instruction.

A pattern generating instruction read out from the pattern generating instruction storage area 113B is supplied to a pattern generating part 120 and the pattern generating part 120 generates a test pattern signal and an address signal in accordance with the pattern generating instruction.

The data selector 200 selects an address signal and a data signal etc. to be applied to the IC under test 300 from the signals generated by the pattern generating part 120 and supplies those signals to the IC under test 300 after shaping the wave forms. Also, the data selector 200 selects an expected value data from the test pattern signals and supplies the expected value data to the logical comparator 400.

In the logical comparator 400, a data read out from the IC under test 300 is logically compared with an expected value data from the data selector 200. When a mismatch is detected in the logical comparison, a failure of the IC under test is determined. Therefore, when a mismatch is not detected, the IC under test 300 can be judged as a good IC. Consequently, a pass/failure decision of the IC under test 300 can be performed.

Since, in the conventional pattern generator 100, the instruction memory 113 must be operated in a speed higher than the pattern generation frequency, it is difficult to improve the sequence control part 110 for higher speed operation. Particularly, in order to make the pattern generation speed higher, all of the instruction memory 113, the program counter controller 111, the program counter 112 and the loop counter 114 etc. must be arranged using elements which allow a higher speed operation. The pattern generating part 120 must also be arranged using high speed operable elements and must take a super multi-stage pipeline structure. Therefore, there is a shortcoming in operating the pattern generator in high speed that a huge expense is necessary, and the equipment becomes expensive and large in physical size even if the equipment is realized.

In addition, even if the expenditure is possible, there is a limit in the operation speed of the high speed operable element. Therefore, in the prior art, it is difficult to increase the pattern generation speed of 100 MHz to several 100 MHz.

DISCLOSURE OF THE INVENTION

It is a first object of the present invention to provide a high speed pattern generator which can generate patterns at high speed that is several times the speed of a conventional pattern generator without need of using elements operable at high speed.

It is a second object of the present invention to provide a high speed pattern generator for which a program for generating patterns at high speed can easily be created without requiring a special programming technique for a high speed operation.

In accordance with a first aspect of the present invention, a high speed pattern generating method is provided which comprises the steps of: converting a series of pattern generating instructions disposed in accordance with a pattern generation sequence to a series of multi-phase sub pattern generating instructions; generating multi-phase sub pattern signals based on this series of sub pattern generating instructions; and time division multiplexing the multi-phase sub pattern signals so that a test pattern signal having an increased speed multiplied by the number of multiplexing can be generated.

In accordance with a second aspect of the present invention, there is provided a high speed pattern generator implementing the high speed pattern generating method according to the first aspect mentioned above.

It is to be noted that in case of implementing particularly the high speed pattern generating method according to the first aspect, there occurs a trouble that sub pattern generating instructions having different contents lo must be written in the same address of the instruction memory. The high speed pattern generator according to the second aspect of the present invention eliminates this trouble, as described later, thereby to realize the high speed pattern generating method according to the first aspect.

In accordance with a third aspect of the present invention, there is provided a high speed pattern generating method which comprises the steps of: outputting from an instruction memory a pattern generating instruction having an argument for prescribing a plurality of sub patterns subsequent to a main pattern; generating a main pattern from a main pattern generating part in accordance with the pattern generating instruction; supplying said main pattern generated from said main pattern generating part to a plurality of sub pattern generating parts; changing said main pattern in said plurality of sub pattern generating parts in accordance with said arguments; delaying said main pattern thereby to generate a plurality of sub patterns subsequent to said main pattern in the same phase as that of said main pattern; and time division multiplexing said main pattern and said plurality of sub patterns in a multiplexing circuit, and taking out the time division multiplexed patterns so that high speed patterns changing in accordance with a predetermined pattern generation sequence are generated.

In accordance with a fourth aspect of the present invention, there is provided a high speed pattern generator which comprises an instruction memory for storing a sequence control instruction and pattern generating instructions and generates a test pattern signal to be applied to a device under test in accordance with a pattern generating instruction read out from the instruction memory, and is arranged such that a main pattern generating instruction and arguments for defining sub patterns to be generated in a predetermined sequence subsequent to a main pattern by changing the main pattern generating instruction are generated from the pattern generating instruction storage area of the instruction memory, the pattern generating instruction is supplied to a main pattern generating part to generate the main pattern from the main pattern generating part, a plurality of sub patterns having respective orders to follow the main pattern are generated from the main pattern in a plurality of sub pattern generating parts, and a high speed pattern signal can be generated by multiplexing the main pattern signal and sub pattern signals in time division, whereby a high speed pattern signal can be generated.

With the configuration of the high speed pattern generator of the fourth aspect, the circuits existing between the sequence control part and the multiplexing circuit for inputting the main pattern signal and the sub pattern signals to the multiplexing circuit can be arranged using circuits which operate at the speed equivalent to the conventional speed. Moreover, even if these circuits are operated in the speed equivalent to the conventional speed, the pattern generating speed can be increased to a speed multiplied by the number of multiplexing. Therefore, according to the present invention, there can be obtained a benefit that a high speed pattern generator can be provided at low cost.

In addition, with the configuration of the high speed pattern generator according to the fourth aspect, since sub patterns are generated by adding an argument (parameter) to a main pattern generating instruction, a programmer may be able to create a program by only defining a main pattern. Therefore, a pattern generating program can easily be created.

BRIEF DESCRIPTION OF THE DRAWINGS

FIG. 4 is a flow chart for explaining the first embodiment of the high speed pattern generating method according to the present invention;

FIG. 7 is a diagram for explaining a relationship between sequence control instructions and patterns, sub patterns when the program shown in FIG. 6 is executed;

FIG. 9 is a diagram for explaining an operation of the sequence control part shown in FIG. 8;

FIG. 14 is a diagram for explaining an address converting operation of the high speed pattern generator shown in FIG. 12;

FIG. 18 is a diagram for explaining a relationship between sequence control instructions generated when the program shown in FIG. 17 is executed and patterns generated by these sequence control instructions;

BEST MODES FOR CARRYING OUT THE INVENTION

Figure 1:
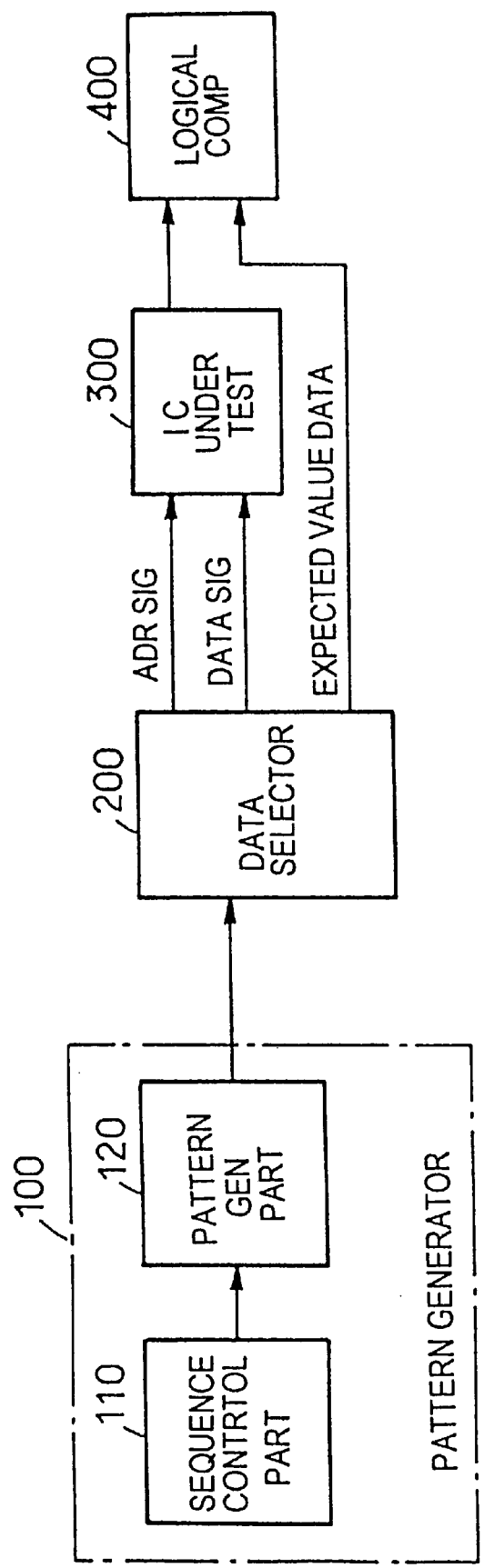
FIG. 1 is a block diagram for explaining an arrangement of an example of a conventional IC testing apparatus.

Now a first embodiment of the high speed pattern generating method according to the present invention will be described beforehand with reference to FIG. 3.

In the present invention, a plurality of sub pattern generating instruction storage areas $113B_1$ to $113B_4$ are provided in an instruction memory 113. In this example, a case is shown in which four sub pattern generating instruction storage areas $113B_1$ to $113B_4$ are provided and four-phase sub pattern generating instructions are generated. Further, the number of phases of the sub pattern generating instruction storage areas $113B_1$ to $113B_4$ is not limited to four and may be equal to or greater than two. As explained before, the sequence control instruction storage area 113A is provided in the instruction memory 113 in addition to the sub pattern generating instruction storage areas $113B_1$ to $113B_4$. It is the same as the conventional technique that an address to be next accessed in the instruction memory is determined by reading out a sequence control instruction stored in the sequence control instruction storage area 113A and a reading sequence of pattern generating instruction is controlled by the sequence control instruction.

The sub pattern generating instructions stored in the sub pattern generating instruction storage areas $113B_1$ to $113B_4$ are transferred from an upper level computer for managing the testing apparatus and are written in the instruction memory 113. That is, a pattern program created in accordance with a pattern generation sequence intended by a user is converted into a multi-phase supporting program by a translation program for converting into a multi-phase program and the sub pattern generating instructions converted into multi phases are transferred to the instruction memory 113 of the testing apparatus to be stored therein.

Next, the relationship between a pattern generating instruction and a sub pattern generating instruction will be explained referring to FIG. 4. In FIG. 4, a reference numeral 10 shows pattern generating instructions (PTN GEN INSTR) for patterns that a user intends to generate, which are listed a step by a step. This example shows a case wherein the pattern generating instructions have been created such that a pattern generating instruction "X<0" for initializing X address pattern to 0 is executed in step 1, a pattern generating instruction "X<X+1" for incrementing the X address pattern by one is executed in the next step 2, the pattern generating instruction "X<X+1" is executed in the succeeding steps 3 through 12, a pattern generating instruction "X<X−1" for decrementing the X pattern address by one is executed in the subsequent steps 13 through 16, the pattern generating instruction "X<X+1" for incrementing the X address pattern by one is executed again in the subsequent steps 17 through 24, and the pattern generating instruction "X<X−1" is executed in the succeeding steps 25 through 28. A reference numeral 11 shows values of the X address patterns (values in X address register) produced when the pattern generating instructions 10 are executed. As shown in the X address patterns 11, in step 1 X=0 is generated at the X address pattern, the X address pattern is sequentially incremented by one (+1) in each step of steps 2 to 12, the X address pattern is sequentially decremented by one (−1) in each step of steps 13 to 16 after reaching X=11 in step 12, and once it is decreased to X=7 in step 16, the X address pattern reaches X=15 in step 24, and the X address pattern reaches X=11 in step 28. The illustrated X address patterns shown in the drawing are supplied to an IC under test in the sequence of steps 1 to 28.

In addition to the X address patterns, there exists Y address patterns, Z address patterns, etc. in practice. However, only X address patterns will be explained herein.

Reference characters 12A, 12B, 12C and 12D in FIG. 4 show sub pattern generating instructions (SUB PTN GEN INSTR). The method for converting the pattern generating instructions to sub pattern generating instructions 12A to 12D is as follows. Each of the pattern generating instructions 10 is assigned to each phase in the step basis in the sequence of pattern generation. Then the pattern generating instructions of the number corresponding to the number of multiplexing phases are summed (performs an algebraic calculation assuming that the register values are variables) going back toward upstream starting from the assigned pattern generating instruction to convert into the sub patterns.

That is, assuming that sub pattern generating instructions 12A are stored in the sub pattern generating instruction storage area $113B_1$, sub pattern generating instructions 12B are stored in the sub pattern generating instruction storage area $113B_2$, sub pattern generating instructions 12C are stored in the sub pattern generating instruction storage area $113B_3$ and sub pattern generating instructions 12D are stored in the sub pattern generating instruction storage area $113B_4$, and a multiplexing is performed in the sequence of the sub pattern generating instruction storage areas $113B_1$, $113B_2$, $113B_3$ and $113B_4$, the pattern generating instruction X<0 in step 1 is assigned to a sub pattern generating instruction croup 12A. Since no pattern generating instruction exists before step 1, the composed sub pattern generating instruction 12A becomes x<0.

Then, the pattern generating instruction X<X+1 in step 2 is assigned to the sub pattern generating instruction group 12B. In this case, since there is a pattern generating instruction X<0 before step 2, X<0 and X<X+1 are summed and a sub pattern generating instruction X<1 is obtained.

Then, the pattern generating instruction X<X+1 in step 3 is assigned to the sub pattern generating instruction group 12C. Since there are a pattern generating instruction X<0 in step 1 and a pattern generating instruction X<X+1 in step 2 before step 3, these pattern generating instructions and the pattern generating instruction X<X+1 in step 3 are summed and a sub pattern generating instruction X<2 is obtained.

Then, the pattern generating instruction X<X+1 in step 4 is assigned to the sub pattern generating instruction group 12D. Since there are a pattern generating instruction X<0 in step 1, a pattern generating instruction X<X+1 in step 2 and a pattern generating instruction X<X+1 in step 3 before step 4, these pattern generating instructions and the pattern generating instruction X<X+1 in step 4 are summed, i.e. four pattern generating instructions the number of which is equal to the number of sub pattern generating instruction storage areas are summed, and a sub pattern generating instruction X<3 is obtained.

Further, (X=0), (X=1), (X=2), (X=3) and (X=4) shown in parentheses below the respective sub pattern generating instructions show the results of the X address pattern generations when the sub pattern generating instructions 12A to 12D are supplied to sub pattern generating parts 120A to 120D. These X address patterns coincide respectively with the X address patterns 11 obtained by executing the pattern generating instructions 10 shown in FIG. 4.

In step 5, the pattern generating instruction X<X+1 is assigned to the sub pattern generating instruction group 12A. This pattern generating instruction X<X+1 and the three pattern generating instructions X<X+1 before step 5 are summed and a sub pattern generating instruction X<X+4 is obtained as the sub pattern generating instruction 12A in step 5.

Similarly hereinafter, the pattern generating instructions X<X+1 of four steps are summed to obtain a sub pattern generating instruction X<X+4 for each of the steps up to 12. Since the pattern generating instruction is changed to X<X−4 in step 13, the sub pattern generating instruction 12A becomes X<X+2. In step 14, the sub pattern generating instruction 12B becomes X<X+0. In step 15, the sub pattern generating instruction 12C becomes X<X−2. In step 16, the sub pattern generating instruction 12D becomes X<X−4. in steps 17 to 20, since the pattern generating instruction in each step is X<X+1, the sub pattern generating instructions 12A to 12D are X<X−2, X<X−0, X<X+2 and X<X+4, respectively.

In steps 21 to 24, since a pattern generating instruction X<X+1 continues, the sub pattern generating instructions 12A to 12D are X<X+4, X<X+4, X<X+4 and X<X+4 in the step sequence. In steps 25 to 28, since the pattern generating instruction changes to X<X−1, the sub pattern generating instructions 12A to 12D change to X<X+2, X<X+0, X<X−2, and X<X−4, respectively.

The sub pattern generating instructions are executed and associated X address patterns can be generated from the respective sub pattern generating parts 120A to 120D by reading out the sub pattern generating instructions 12A to 12D step by step from the sub pattern generating instruction storage areas 113B$_1$ to 113B$_4$ respectively and by inputting them to the sub pattern generating parts 120A, 120B, 120C and 120D respectively.

Figure 5:
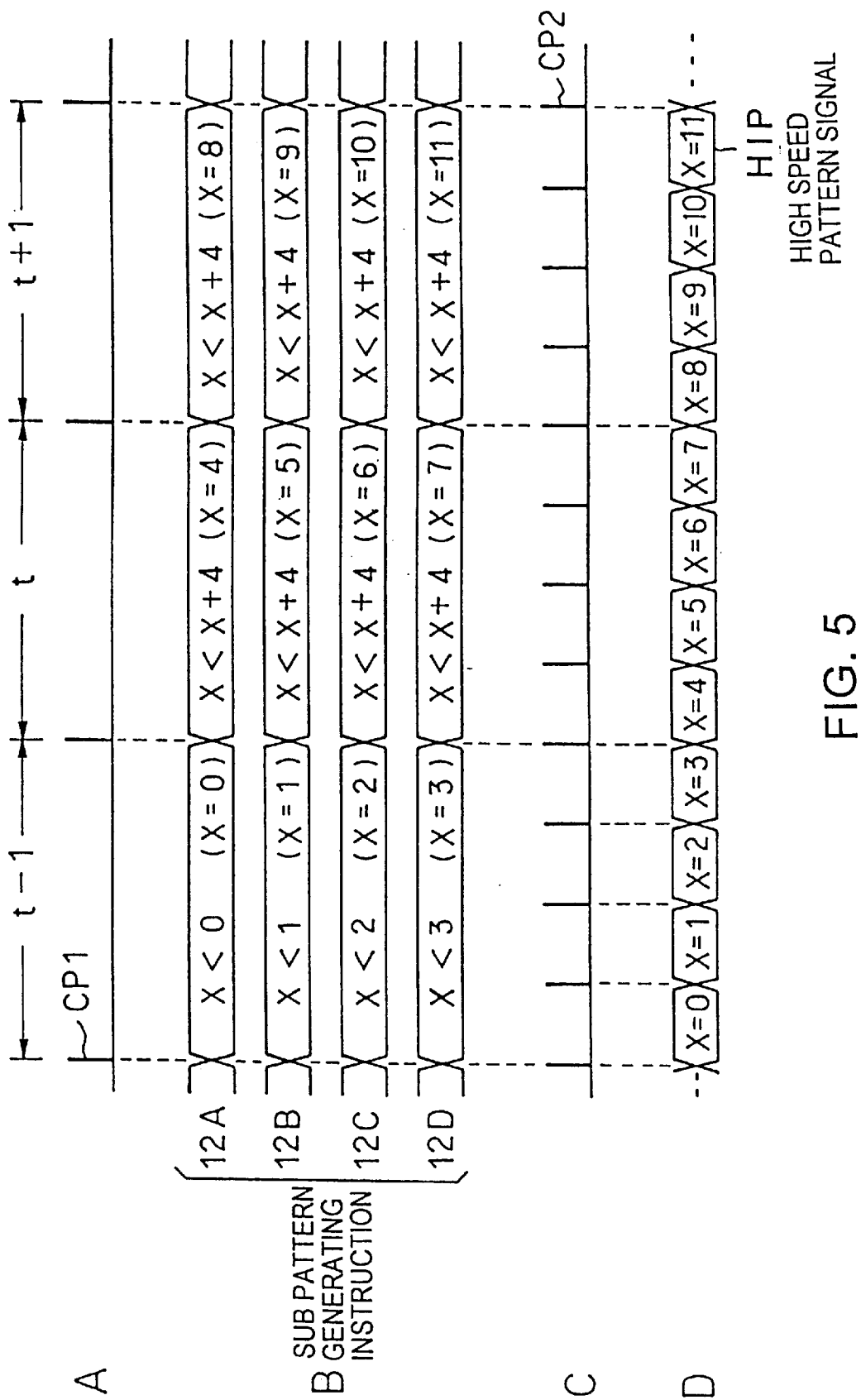
FIG. 5 is a timing diagram for explaining an operation of an essential part of the first embodiment of the high speed pattern generator according to the present invention.

FIG. 5 shows a relationship between the sub pattern generating instructions read out from the sub pattern generating instruction storage areas 113B$_1$ to 113B$_4$ and the X address patterns generated by these sub pattern generating instructions in the sub pattern generating parts 120A to 120D. At a period t−1 of a clock CP1, the sub pattern generating instructions X<0, X<1, X<2 and X<3 are read out from the sub pattern generating instruction storage areas 113B$_1$ to 113B$_4$ respectively. These sub pattern generating instructions X<0 to X<3 are supplied to the respective sub pattern generating parts 120A to 120D to generate X address patterns X=0, X=1, X=2 and X=3 respectively. By supplying these X address patterns X=0, X=1, X=2 and X=3 to the multiplexing circuit 130 and by multiplexing the X address patterns in time division using a clock CP2 in the order of X=0, X=1, X=2 and X=3, a high speed pattern signal HIP having a frequency multiplied by the number of multiplexing as shown in FIG. 5D can be obtained.

At a period of the CP1, all the sub pattern generating instructions read out from the sub pattern generating instruction storage areas 113B$_1$ to 113B$_4$ are X<X+4. When these sub pattern generating instructions X<X+4 are executed in the sub pattern generating parts 120A to 120D, upon the execution of X<X+4, X address patterns X=4, X=5, x=6 and X=7 are obtained as X=0, X=1, X=2 and X=3 have already been inputted at the previous period t−1.

As is apparent from the above explanation, according to the high speed pattern generating method of the present invention, the sub pattern generating instruction storage areas 113B$_1$ to 113B$_4$ the number of which corresponds to the number of multiplexing are provided in the instruction memory 113, and the sub pattern generating instructions 12A to 12D are read out from the plurality of sub pattern generating instruction storage areas 113B$_1$ to 113B$_4$ and are supplied to the sub pattern generating parts 120A to 120D. In this arrangement, a high speed pattern signal HIP arrayed in the original sequence to be applied to an IC under test can be obtained by generating the multi-phase sub patterns and by multiplexing the multi-phase sub patterns in accordance with a predetermined sequence in the multiplexing circuit 130.

Therefore, even if the portion of the pattern generator up to the multiplexing circuit 130 is arranged using circuits which operate in the speed equivalent to the speed of a conventional pattern generator, the high speed pattern signal HIP outputted from the multiplexing circuit 130 is a high speed pattern signal having a speed multiple of the number of multiplexing. That is, as in the embodiment mentioned above, when the number of multiplexing is N=4, a high speed pattern signal having four time speed can be obtained. When the reading speed of the sub pattern generating instructions from the instruction memory 113 is 100 MHz, a high speed pattern signal having 400 MHz speed can by obtained.

Further, when the aforementioned sub pattern generating instructions are written in the instruction memory 113, a trouble occurs as described below. That is, there is a sequence control instruction storage area 113A in the instruction memory 113 in addition to the sub pattern generating instruction storage areas 113B$_1$ to 113B$_4$. A sequence control instruction for determining an address for accessing the instruction memory 113 next is written in the secuence control instruction storage area 113A and the sequence control instruction is read out to determine an address for accessing next.

Figure 6A:
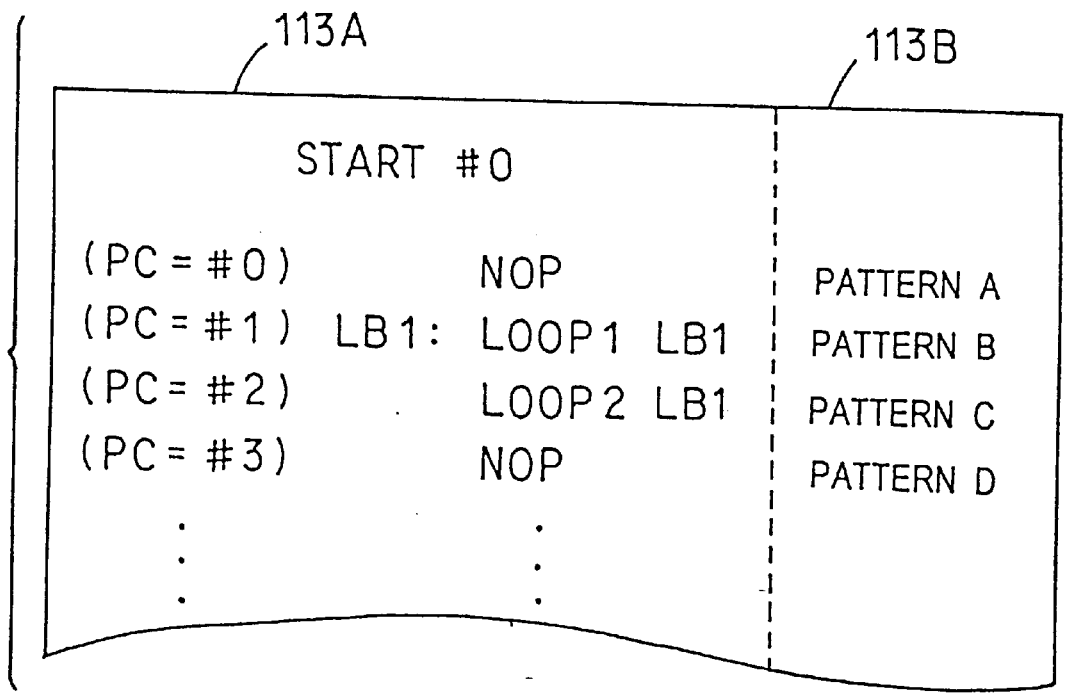
FIGS. 6A and 6B are diagrams showing an example of a program for generating a pattern.
Figure 6B:
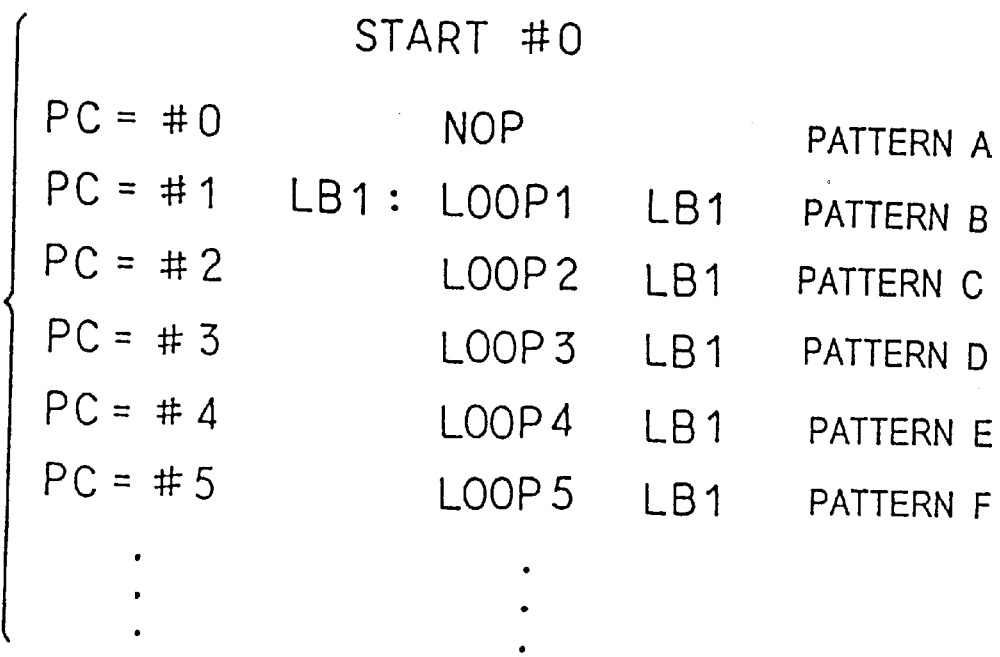

FIGS. 6A and 6B show a simple program example for generating a sequence control instruction and a test pattern. START #0 is an instruction for initializing the program counter 112 (refer to FIG. 2) to #0. PC=#0, PC=#1, . . . show the values of the program counter 112, i.e., the addresses of the instruction memory 113. The sequence control instructions shown at the respective right sides of the PC=#0, PC=#1, . . . are stored in the addresses respectively. An NOP instruction is written in the address #0 of the sequence control instruction storage area 113A (FIG. 1) of the instruction memory 113. The NOP instruction is an instruction for "adding +1 to the program counter value and executing the next instruction".

Therefore, the program counter 112 outputs PC=#1 and LB1:LOOP1 LB1 written in the address #1 of the sequence control instruction storage area 113A of the instruction memory 113 is executed. LB1 is a label name and LOOP1 is an instruction for repeatedly executing rows between the instruction row and the row indicated by a label described following the instruction a specified number of times. In the case of LB1:LOOP1 LB1, this instruction row is repeatedly executed a specified number of times. The specified number of times is stored in the initial value storing register 115 shown in FIG. 2. When the loop is executed a specified number of times, the loop counter 114 detects the state and the address value outputted from the program counter 112 is incremented by one.

When, for example, "2" is stored in the initial value storing register 115, the program counter 112 adds +1 to the address to be outputted and the process moves to the next row after executing the LOOP1 instruction twice. In the next row, an instruction LOOP2 LB1 written in address #2 of the instruction memory 113 is executed. This instruction is an instruction for executing LOOP2 once and then returning to the row indicated by the label LB1. Actually, it is repeated that the instruction LB1:LOOP1 LB1 is executed, for example, several hundred times and then the instruction LOOP2 is executed once.

On the other hand, the pattern generating instructions are written in the test pattern generating instruction storage area 113B shown in FIGS. 6A and 6B. Test patterns are generated by the pattern generating instructions read out from the addresses #0, #1, #2, . . . of the instruction memory 113 determined by executing the sequence control instructions. In the case where a pattern generating instruction read out from the address #0 is A, a pattern generating instruction read out from the address #1 is B and a pattern generating instruction read out from the address #2 is C, when a sequence control instruction LOOP1 is executed twice and LOOP2 is executed once and then an operation to return to a label LB1 again is executed, the relationship between each cycle, the address values (PC values) outputted from the address counter 112, the sequence control instructions and the patterns A to C is shown in FIG. 7.

If the patterns A, B, C, . . . are independent patterns which do not mutually relate to, the pattern A may be written in address #0 of the pattern generating instruction storage area 113B, the pattern B may be written in address #1 and the pattern C may be written in address #2.

However, in order to perform multiplexing processes, as shown in FIG. 4, the sub pattern generating instructions 12A to 12D may have to generate different sub pattern generating instructions dependent on the patterns in the previous cycle even if the sub pattern generating instruction is read out by the same loop instruction. This state is shown in the column of sub pattern in FIG. 7. In cycle 1, the sub pattern generating instruction A can be written in address #0 as no history exists. In cycle 2, a sub pattern A~B which is determined by the pattern A of cycle 1 and the pattern B described in that row is written in address #1. Similarly, the sub pattern of cycle 3 is B~B, the sub pattern of cycle 4 is B~C, the sub pattern of cycle 5 is C~B, the sub pattern of cycle 6 is B~B, and the sub pattern of cycle 7 is B~C.

As is apparent from the above description, the sub patterns A~B, B~B and C~B generated in cycles 2, 3, 5 and 6 must be written in a same address #1. Such phenomena often occur, as shown in FIG. 6B, when operations for returning to a common label LB1 from multiplexed loop instructions LOOP2 to LOOP5 . . . are performed.

Further, when the historic indications A~B, B~B, B~C . . . of sub patterns explained referring to FIG. 7 are applied to FIG. 4, the sub patterns A~B generated in steps 5 to 8 and the sub patterns B~B generated in steps 9 to 12 look like the same pattern generating instruction because the sub pattern generating instructions are all X<x+4. However, the system must be arranged such that a normal operation can always be performed wherever in steps 1 to 4, for example, an initializing instruction X<0 is described by the user. Consequently, when X<0 is described in, for example, step 2, the sub pattern generating instruction in step 5 becomes X<3. Therefore, the sub pattern generating instructions for A~B and B~B must be treated as different sub pattern generating instructions in accordance with the sub pattern history.

As mentioned above, it will be understood that when sub patterns in multiplexing process are written in an instruction memory, different sub pattern generating instructions (referred to as pattern generating instructions of different kind, hereinafter) may have to be written in the same address.

A first embodiment of a high speed pattern generator according to the present invention proposes, in order to resolve this trouble, a high speed pattern generator wnich normally operates, by providing an address converting part to store pattern generating instructions of different kind in different addresses.

Figure 8:
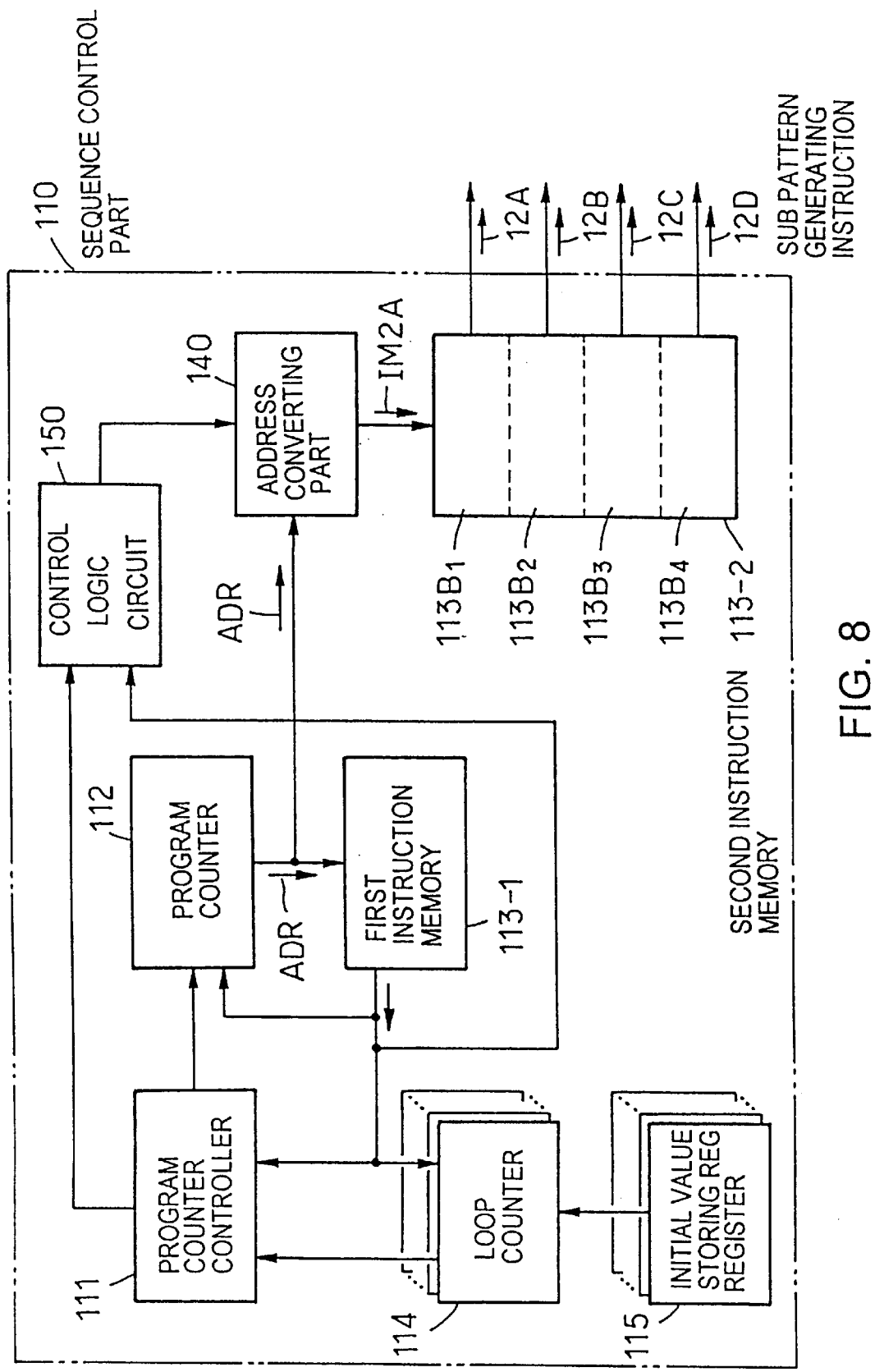
FIG. 8 is a block diagram showing a specific example of a sequence control part used in a second embodiment of the high speed pattern generator according to the present invention.

FIG. 8 shows a specific example of a sequence control part 110 having an address converting part used in a high speed pattern generator. Same reference characters are assigned to the portions corresponding to those in FIG. 2. The configuration characterized by the sequence control part 110 is that the instruction memory 113 is divided into a first instruction memory 113-1 and a second instruction memory 113-2, an address to be supplied to the first instruction memory 113-1 is converted into a different address in the address converting part 140, and the converted address is supplied to the second instruction memory 113-2.

Figure 3:
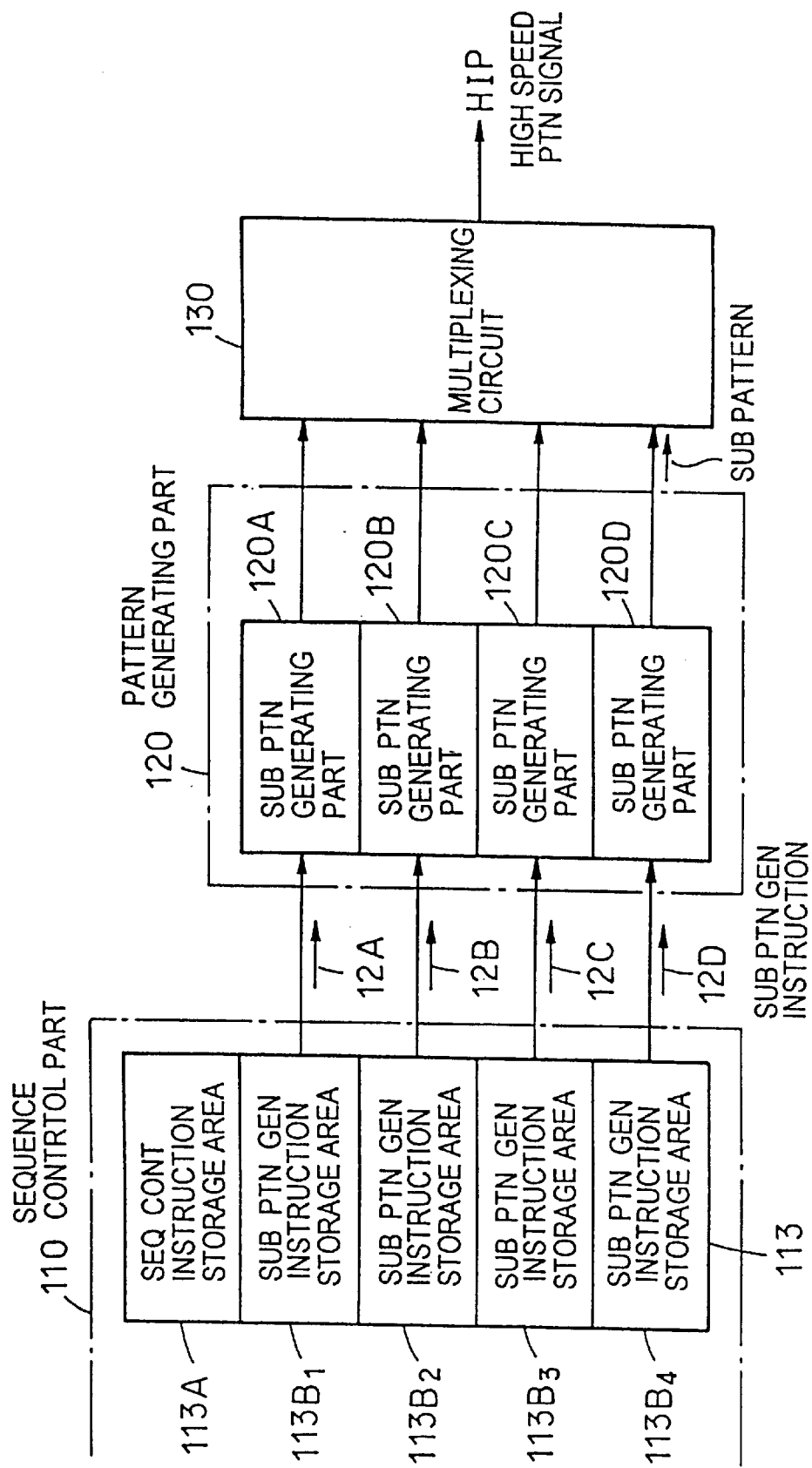
FIG. 3 is a block diagram for explaining a first embodiment of a high speed pattern generating method according to the present invention.

The sequence control instruction storage area 113A shown in FIG. 3 is provided in the first instruction memory 113-1 and this sequence control instruction storage area 113A is accessed by an address signal ADR (#0, #1, #2, . . . ) outputted from the program counter 112. Sub pattern generating instruction storage areas $113B_1$, $113B_2$, $113B_3$ and $113B_4$ are provided in the second instruction memory 113-2. The address capacity of the second instruction memory 113-2 is selected to be larger than the address area of the first instruction memory 113-1, for example, double address area of the first instruction memory 113-1. By making the address area of the second instruction memory 113-2 double of the first instruction memory 113-1, an address area specified by addresses #0, #1, #2, #3, . . . outputted from the program counter 112 is secured in the first half of the address area of the second instruction memory 113-2. Further, the pattern generating instructions of different kind which cannot be written in the addresses #0, #1, #2, #3, . . . may be written in the second half address area of the second instruction memory 113-2.

Figure 10:
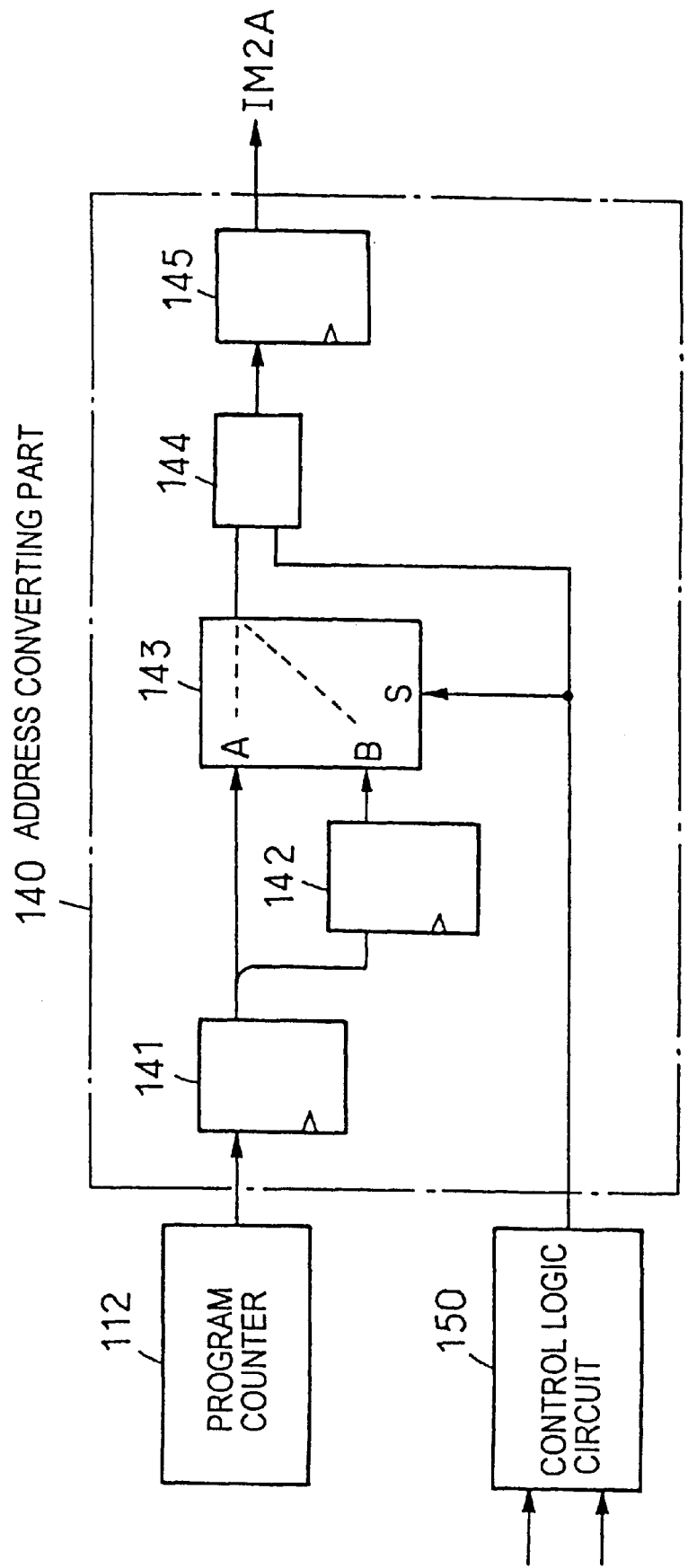
FIG. 10 is a block diagram showing a specific example of an address converting part shown in FIG. 8.

FIG. 10 shows a specific configuration of the address converting part 140. The address converting part 140 can be arranged by address delay means 142 for delaying by one cycle an address signal outputted from the program counter 112, selector means 143 for selecting and taking out either one of the address signal delayed by one cycle in the address delay means 142 or the address signal not delayed, and adding means 144 for adding a predetermined value to the address signal outputted from the program counter 112 when the selector means selects the address signal delayed by one cycle. Further, in FIG. 10, the reference numerals 141 and 145 indicate flip-flops for re-timing, respectively.

A control signal is supplied to a control terminal S of the selector means 143 from a control logic circuit 150 to select either one of the address signal delayed in the delay means 142 or the address signal not delayed. After acquiring a sequence control instruction read out from the program counter controller 111 and the first instruction memory 113-1, the control logic circuit 150 outputs a control signal which is a logical "0" when the address value outputted from the program counter 112 changes to a value incremented by one, or the control logic circuit 150 outputs a control signal which is a logical "1" when the address value outputted from the program counter 112 is a value other than value incremented by one. In the state where the control logic circuit 150 outputs a logical "0", the selector means 143 selects the input terminal A and outputs the address signal outputted from the program counter 112 as it is. When the control logic circuit 150 outputs a logical "1", the selector means 143 selects the input terminal B to select the address signal delayed by one cycle in the delay means 142 and then, outputs the delayed address signal to the adding means 144. In the adding means 144, a predetermined value is added to the address signal outputted from the program counter 112 by adding the one bit of the control signal outputted from the control logic circuit 150 to the upper bit portion of the address signal selected by the selector means 143. That is, the address area is increased to a double address area by adding one bit to the upper bit portion of the address signal outputted from the program counter 112. Thus, it becomes possible that sub pattern generating instructions (pattern generating instructions of different kind) which cannot be written in the address area specified by the address signal outputted from the program counter 112 are written in the address area expanded to double. In the example shown in FIG. 9, the value added in the adding means 144 is #400 as the program counter 112 has 10 bits.

FIG. 9 shows the address converting operations when LOOP1 instruction is repeated four times and LOOP2 instruction is repeated twice in the program example of FIG. 6A. When the address (PC) value outputted from the program counter 112 is incremented by one, the address IM2A of the second instruction memory 113-2 is not converted and the PC becomes PC=IM2A. In the case in which the PC value is other than a value incremented by one, an address converting process for adding +#400 to a PC value delayed by one cycle is performed. Therefore, in the steps in which sub patterns are changed, every pattern generating instruction of different kind which is generated transitively can be stored in the second instruction memory 113-2 without any exception.

In this case, the address converting part 140 is arranged such that the selector means 143 selects an address signal delayed by one cycle when an address value outputted from the program counter 112 changes to a value other than a value incremented by one. Therefore, as in the pattern generation program shown in FIG. 6B, even if the process returns from many loop instructions to LOOP1 specified by a label LB1, the predetermined value #400 is added to the address where a loop instruction executed in the previous cycle is described, to perform an address conversion. Consequently, even if the process returns to LOOP1 from any one of the loop instructions, an address duplication will not occur.

Figure 11:
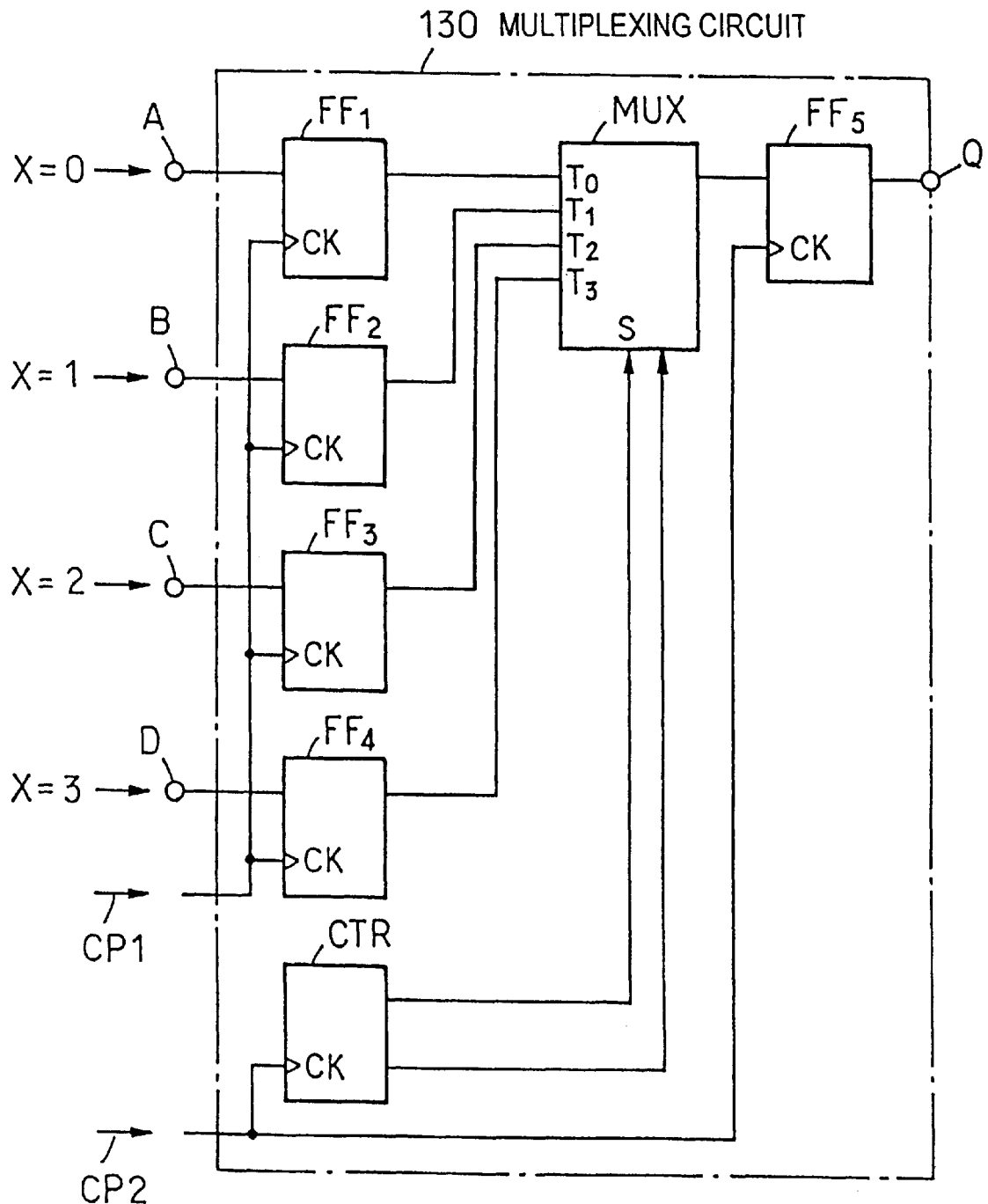
FIG. 11 is a circuit connection diagram showing a specific example of a multiplexing circuit used in the high speed pattern generator according to the present invention.

FIG. 11 shows a specific example of the multiplexing circuit 130. Sub patterns X=0, X=1, X=2 and X=4 (refer to FIG. 5) generated respectively by the sub pattern generating parts 120A, 120B, 120C and 120D of the sub pattern generator 120 shown in FIG. 3 are supplied to input terminals A, B, C and D, respectively. Flip-flops $FF_1$, $FF_2$, $FF_3$ and $FF_4$ are coupled to the input terminals A, B, C and D, respectively. The clock CP1 shown in FIG. 5 is supplied to each clock input terminal CK of the flip-flops $FF_1$ to $FF_4$. The sub patterns X=0, X=1, X=2 and X=3 are taken in the flip-flops $FF_1$ to $FF_4$ respectively in the period of the clock CP1. Outputs of the flip-flops $FF_1$ to $FF_4$ are coupled respectively to input terminals $T_o$ to $T_3$ of the multiplexer MUX. A count output of the clock CP2 (refer to FIG. 3) is supplied to a control input terminal S of the multiplexer MUX from a counter CTR. The four input terminals are sequentially switched to sequentially output the sub patterns X=0, X=1, X=2 and X=3 from an output terminal Q as shown in FIG. 5D. Thus, a high speed pattern signal HIP is outputted. In the next cycle of the clock CP1, sub patterns X=4, X=5, X=6 and X=7 are inputted to the flip-flops $FF_1$ to $FF_4$, respectively. These sub patterns are multiplexed and outputted to the output terminal Q as a high speed pattern signal HIP. After that the above operation is repeated and a high speed pattern signal changing in a desired sequence can be generated.

Figure 12:
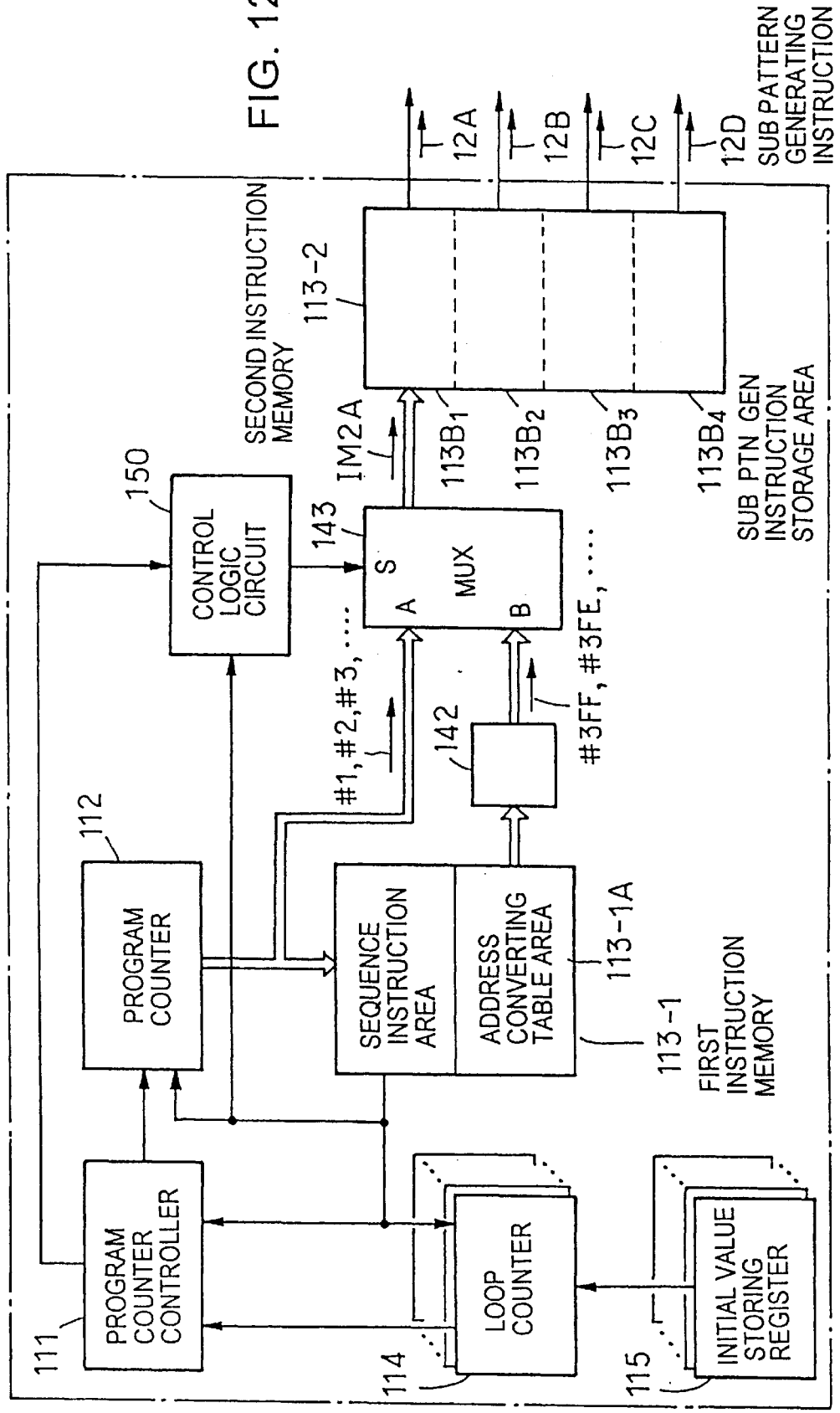
FIG. 12 is a block diagram for explaining a specific example of the sequence control part used in the high speed pattern generator according to the present invention.

FIG. 12 shows a second embodiment of the high speed pattern generator according to the present invention. In this embodiment, a first instruction memory 113-1 and a second instruction memory 113-2 each having 10 bit address are made of memories of the same address capacity respectively. In the sequence in which a pattern generating instruction of different kind is generated, an address where its sequence control instruction is described is converted to an address which is sequentially decremented every time by one starting from the last address of the second instruction memory 113-2.

In this embodiment, an address converting table area 113-1A is provided in the first instruction memory 113-1 and address converting table data are written in this area. An address converting table data is an address value for storing a pattern generating instruction of different kind transitively generated in the steps where sub patterns change. When a sequence instruction such as LOOP instruction, etc. which performs an operation other than an operation for incrementing the program counter by one is described in a pattern program, values of the address converting table data #3FF, #3FE, #3FD, #3FC, . . . which are decremented by one in the occurrence sequence from the last address #3FF of the second instruction memory 113-2 are allocated by a translation program.

Figure 13:
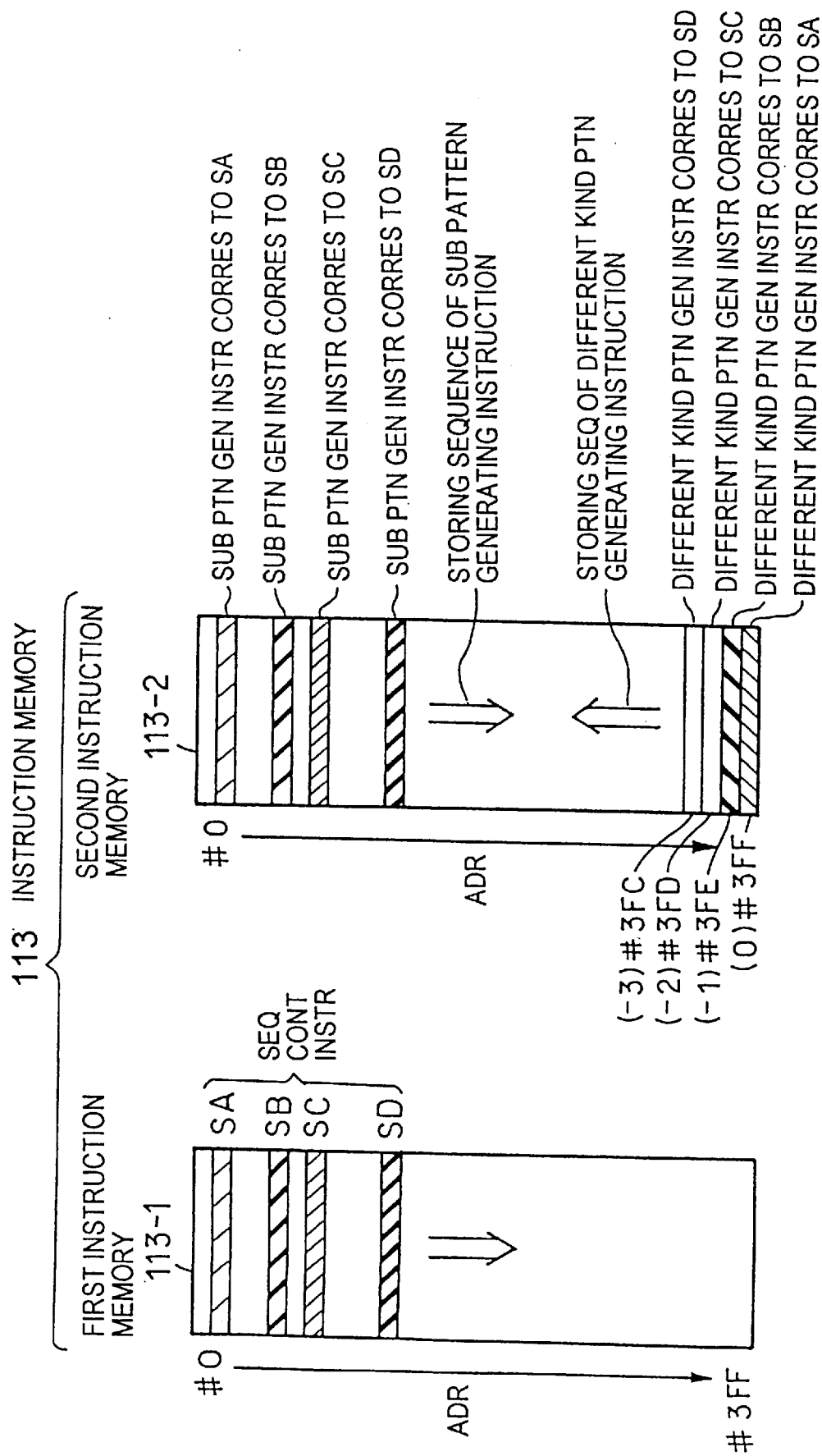
FIG. 13 is a diagram for explaining an arrangement of an address space of an instruction memory used in the high speed pattern generator shown in FIG. 12.

FIG. 13 shows the address allocation state in the first instruction memory 113-1 and the second instruction memory 113-2. In the side of the first address #0 of the first instruction memory 113-1, sequence control instructions SA, SB, SC and SD are written in the addresses specified for the sequence control instructions sequentially from #0. The sequence control instructions SA, SB, SC and SD such as LOOP instructions, etc. each of which performs an operation other than an operation for incrementing the program counter by one are also written in the instruction memory 113-1 without any exception. Sub pattern generating instructions are written in the same addresses of the second instruction memory 113-2 as those of the first instruction memory. Further, pattern generating instructions of different kind such as LOOP instructions, etc. corresponding to the sequence control instructions SA, SB, SC and SD each of which performs an operation other than an operation for incrementing the program counter by one are written in the side of the last address of the second instruction memory 113-2, i.e., in the order of #3FF, #3FE, #3FD, #3FC, . . . in this example.

Either one of a converted address signal outputted from the address converting table area 113-1A or an address signal outputted from the program counter 112 is selected by the selector means 143 and is supplied to the second instruction memory 113-2. The converted address signal outputted from the address converting table area 113-1A is delayed by one cycle in the address delay means 142 and is inputted to the selector means 143. The selector means 143 is controlled by a control signal of the same control logic circuit 150 as explained with reference to FIG. 10.

FIG. 14 shows an address conversion result when LOOP1 instruction is repeated four times and LOOP2 instruction is repeated twice. In this case, as shown in cycle 7, when the program counter changes to a value other than a value incremented by one, #3FE which is converted from the address #2 of the previous cycle is delayed in the address delay means 142 and is supplied to the second instruction memory. After that, #3FF which is converted from #1 where a sequence control instruction is read out in cycle 7 is supplied to the second instruction memory. Therefore, by this operation, even in the case where the process returns to a same loop from many loops as shown in FIG. 6B, duplicated addresses are not generated.

Similarly to the embodiment explained with reference to FIG. 10, with the arrangement shown in FIG. 14, pattern generating instructions of different kind can also be stored in the second instruction memory 113-2 and be read out therefrom.

Figure 15:
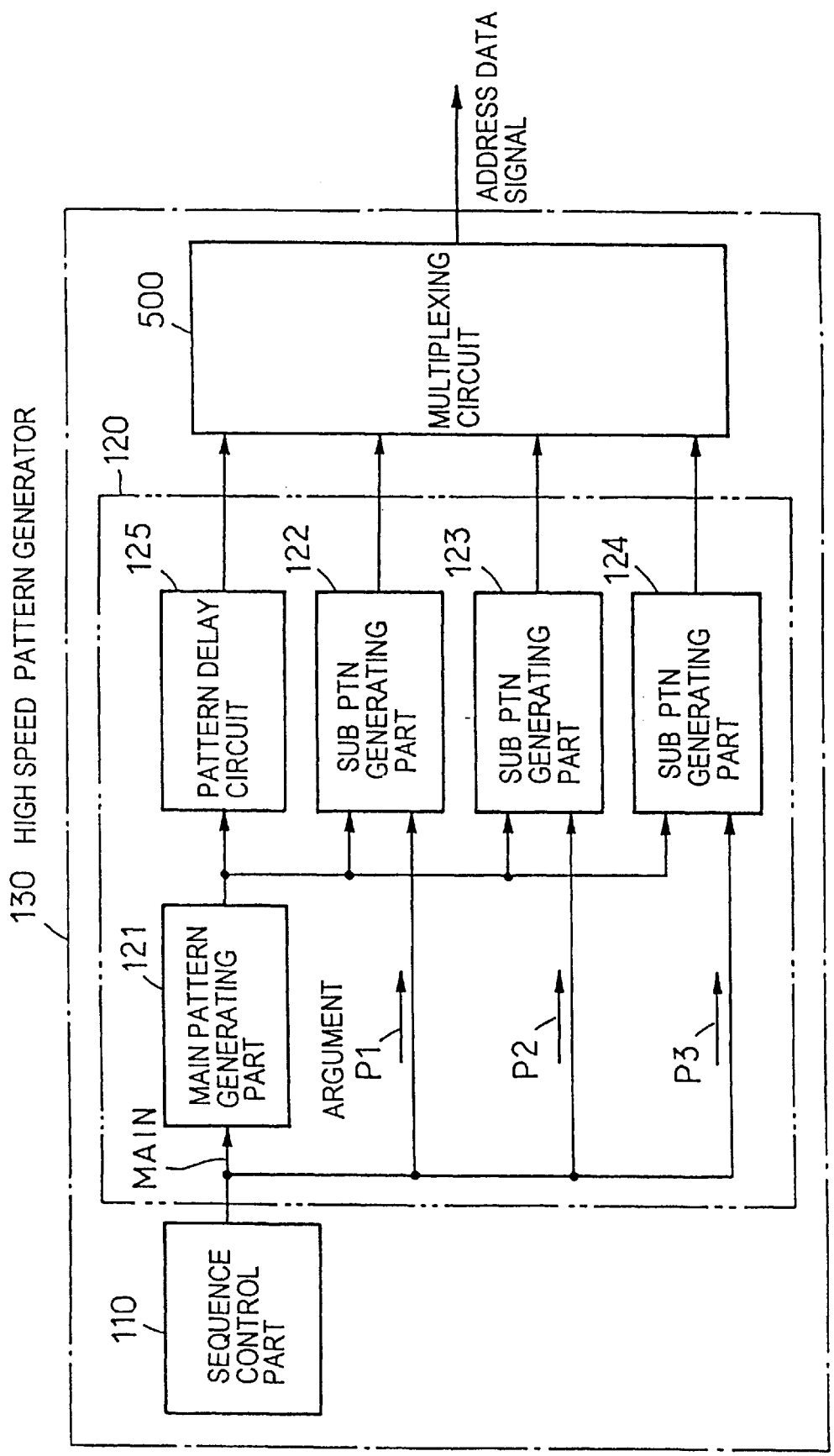
FIG. 15 is a block diagram for explaining a third embodiment of the high speed pattern generator according to the present invention.

Next, a second embodiment of the high speed pattern generating method according to the present invention and a third embodiment of the high speed pattern generator according to the present invention will be explained with reference to FIG. 15. As shown in FIG. 15, the high speed pattern generator 130 in the third embodiment comprises a sequence control part 110, a pattern generating part 120 and a multiplexing circuit 500 for multiplexing in time division the test patterns generated by the pattern generating part 120. That is, in this embodiment, an arrangement for obtaining a high speed pattern signal by multiplexing is employed. Therefore, pattern signals distributed to the number of paths corresponding to the number of multiplexing must be generated. Consequently, in this embodiment, a main pattern generating instruction MAIN and arguments (parameters) P1, P2 and P3 for defining predetermined patterns following the main pattern are generated from the sequence control part 110 at every sequence control.

The main pattern generating instruction MAIN is inputted to a main pattern generating part 121 to generate a main pattern. On the other hand, the parameters P1, P2 and P3 are supplied to respective sub pattern generating parts 122, 123 and 124. The main pattern generated from the main pattern generating part 121 is also supplied to these sub pattern generating parts 122, 123 and 124. These sub pattern generating parts 122, 123 and 124 generate patterns to be applied to an IC under test 300 in the sequence following the main pattern based on the main pattern using the parameters P1, P2 and P3.

The constitution and operation of each part will be now explained in detail.

Figure 2:
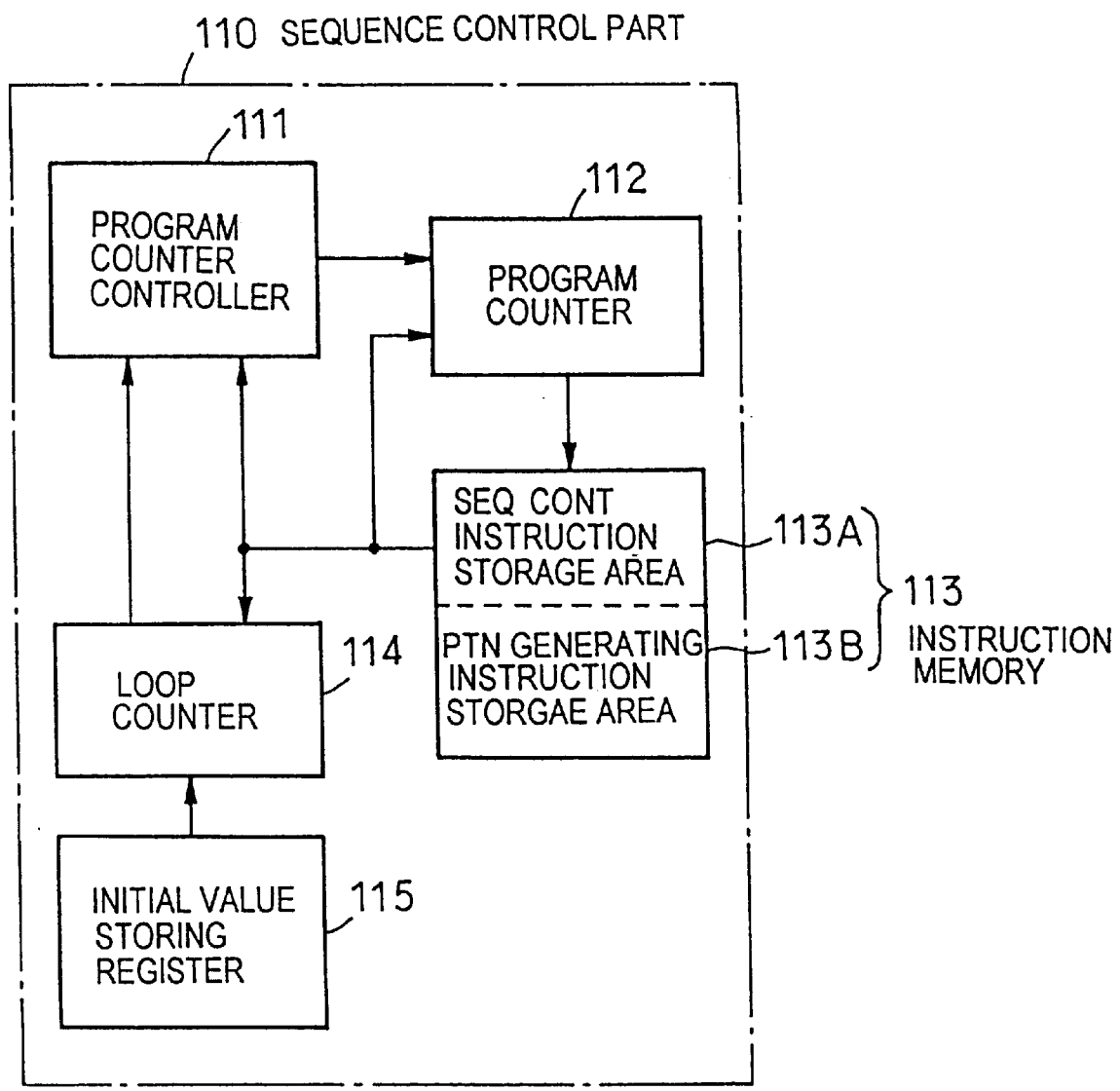
FIG. 2 is a block diagram for explaining a sequence control part used in a conventional IC testing apparatus.
Figure 16:
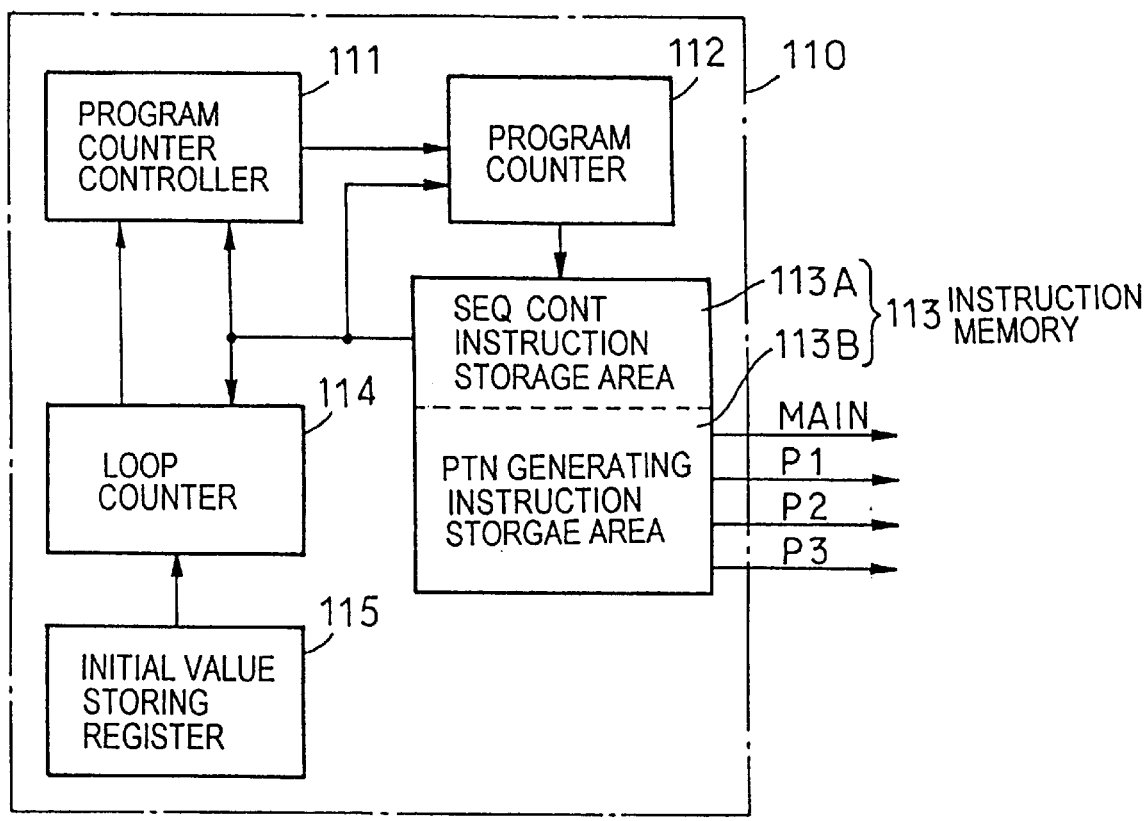
FIG. 16 is a block diagram for explaining an arrangement of the sequence control part used in the high speed pattern generator shown in FIG. 15.

The sequence control part 110 comprises, similarly to the conventional example shown in FIG. 2, a program counter controller 111, a program counter 112, an instruction memory 113, a loop counter 114 and an initial value storing register 115. However, as shown in FIG. 16, the sequence control part 110 in this case is different from the conventional example in the point that a main pattern generating instruction MAIN and a plurality of parameters P1, P2 and P3 are generated from the pattern generating instruction storage area 113B of the instruction memory 113 for every sequence control instruction.

Figure 17:
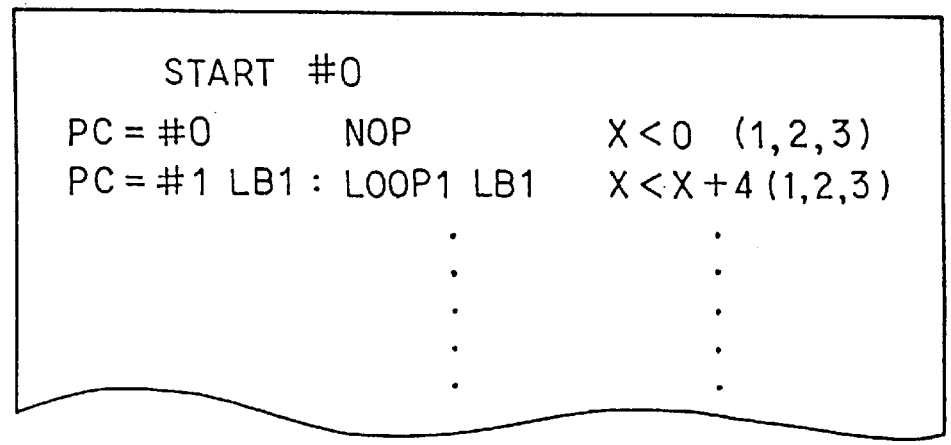
FIG. 17 is a diagram for explaining an example of a program for driving the sequence control part shown in FIG. 16.

FIG. 17 shows an example of a pattern program for generating the pattern generating instructions. START #0 means that the pattern generation is started from the first address outputted from the program counter 112. NOP is executed at address #0. NOP means that the address is incremented by one. Therefore, the address is changed to #1 in the next row. In the second row, repetitive executions of the label LB1 are effected by the number of times N specified by loop instruction LOOP1. The repetitive times N is defined by a set value stored in the initial value storing register 115.

X<0 (1, 2, 3) and X<X+4 (1, 2, 3) described in the first row and the second row respectively are the pattern generating instructions. In this case, X<0 and X<X+4 represent main pattern generating instructions. X<0 is an instruction for initializing the X address register to 0, and X<+4 is an instruction for adding +4 to a value of the X address register and for storing the calculation result in the X address register. The numerals in (1, 2, 3) indicate values of parameters P1, P2 and P3, respectively, and are added to the main pattern in the sub pattern generating parts 122, 123 and 124, respectively.

FIG. 18 shows, when the pattern program shown in FIG. 17 is executed, the relationship between a main pattern generating instruction MAIN, a main pattern generated by the main pattern generating instruction MAIN and sub patterns generated by the sub pattern generating parts 122 to 124.

Figure 19:
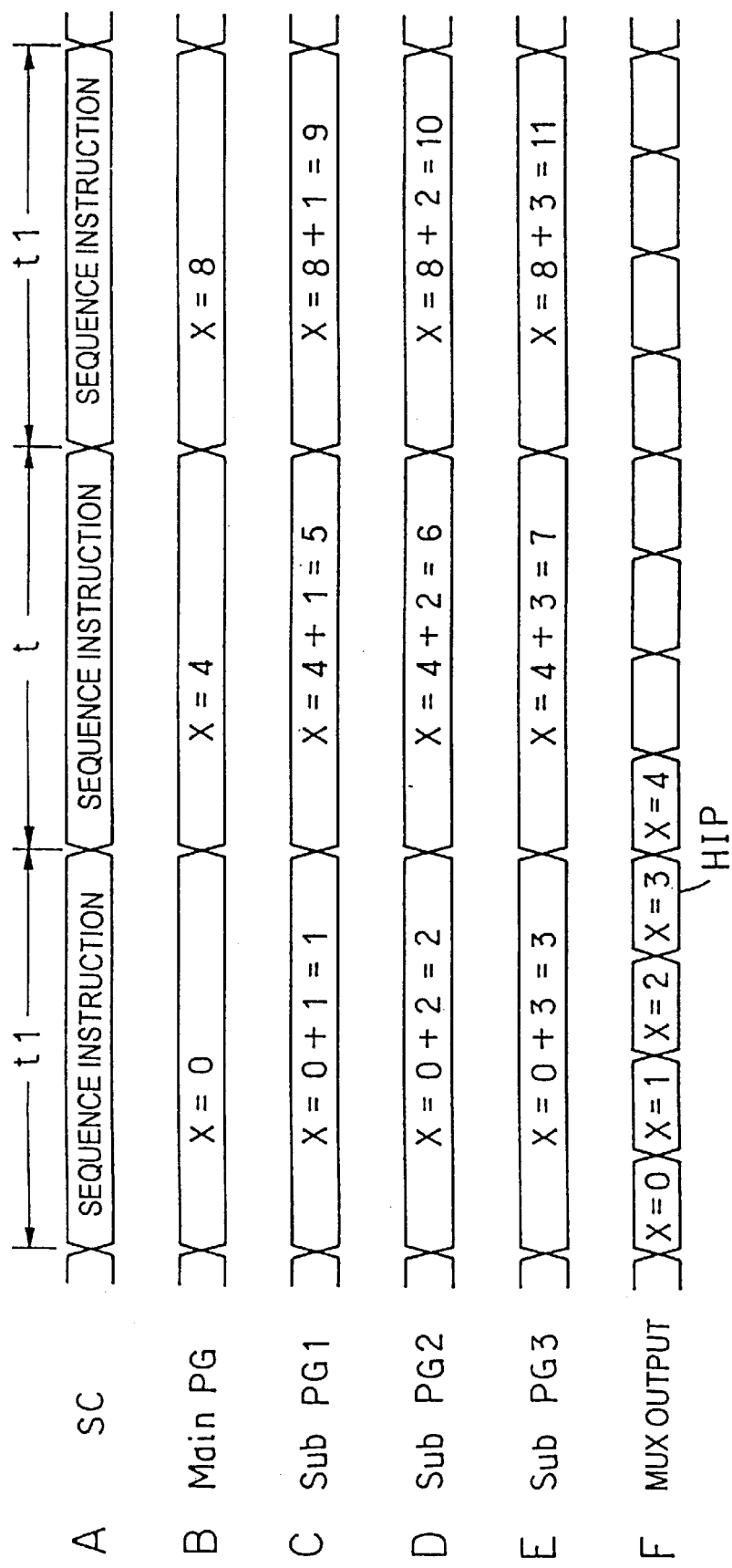
FIG. 19 is a wave form diagram for explaining an operation or the high speed pattern generator shown in FIG. 15.

When a main pattern generating instruction is supplied to the main pattern generating part 121 shown in FIG. 15 and parameters P1, P2 and P3 are supplied to the sub pattern generating parts 122, 123 and 124, respectively, the main pattern generating parts 121 outputs X=0 as an X address pattern and the sub pattern generating parts 122, 123 and 124 output X=0+1, X=0+2 and X=0+3, respectively. FIG. 18 shows a case in which the loop instruction LOOP1 shown in FIG. 17 is repeated ten times. Therefore, the pattern generating instructions generated in steps 2 to 11 shown in FIG. 18 generate X<X+4 (1, 2, 3) described in the loop instruction LOOP1. When this pattern generating instruction X<X+4 is supplied to the main pattern generating part 121, the main pattern generating part 121 outputs X=4 as a main pattern and the sub pattern generating parts 122, 123 and 124 output patterns X=4+1, X=4+2 and X=4+3 respectively as shown in the second cycle t in FIG. 19.

In such a way, the main pattern generating part 121 and the sub pattern generating parts 122, 123, 124 output step after step groups of continuous patterns X=1, X=2, X=3; X=5, X=6, X=7; and X=9, X=10, X=11 respectively following main patterns X=0, X=4, X=8, . . .

Figure 20:
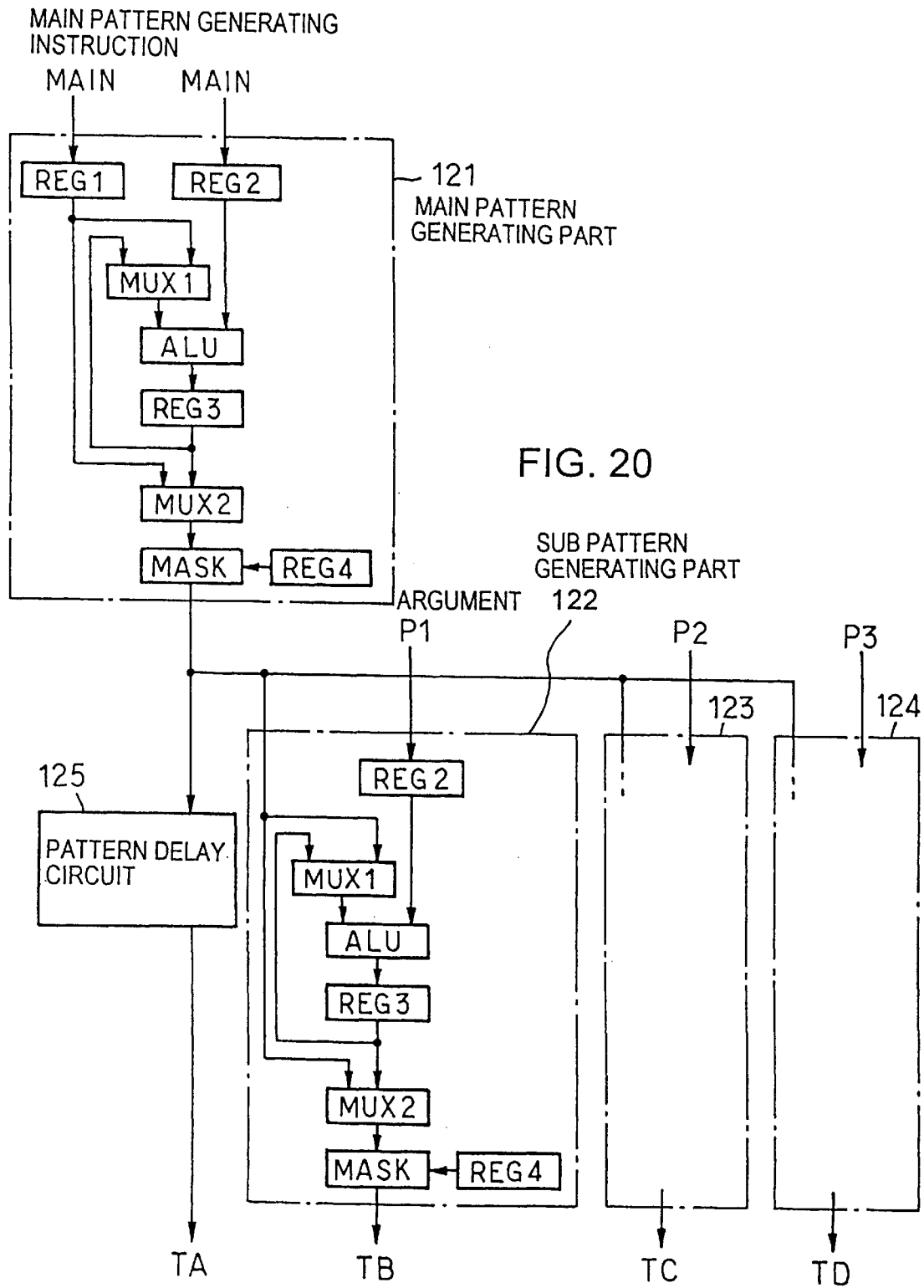
FIG. 20 is a block diagram for explaining a specific example of a main pattern generating part and a sub pattern generating part used in the high speed pattern generator shown in FIG. 15.

FIG. 20 shows a specific embodiment of the main pattern generating part 121 and the sub pattern generating parts 122, 123 and 124. The main pattern generating part 121 can be arranged by four registers REG1, REG2, REG3 and REG4, an adder ALU, two multiplexers MUX1 and MUX2, and a mask gate MASK.

A main pattern generating instruction X<0 or X<x+4 or the like is inputted to the register REG1 of the main pattern generating part 121 from the sequence control pars 110 and a value of X is stored therein. A parameter 0 from the sequence control part 110 is stored in the register REG2 of the main pattern generating part 121. The multiplexer MUX1 initially selects the register REG1 and the value of X stored in the register REG1 is added to a value stored in the register REG2 and then the added result is stored in the register REG3. When the pattern generating instruction is X<0, X is initialized to 0 and is stored in the register REG1. Therefore, the adder ALU calculates X=0+0 and X=0 is stored in the register REG3. The value of X stored in the register REG3 is sent to a pattern delay circuit 125 via the multiplexer MUX 2 and the mask gate MASK, and is outputted to an output terminal TA after being appropriately delayed. Further, the maximum value of the pattern to be applied to an IC under test 300 is set in the register REG4.

When the value of the register REG3 exceeds the value of the register REG4, the mask gate MASK inhibits that a value greater than the set value in the register REG4 is applied to an IC under test 300. The pattern delay circuit 125 is provided in order to delay a test pattern generated by the main pattern generating part 121 by the same delay time as the delay time in the sub pattern generating parts 122, 123 and 124, thereby to output the test patterns to output terminals TA to TD in the same phase.

When a pattern generating instruction X<X+4 is inputted to the register REG1 of the main pattern generating part 121, X=4 is stored in the register REG1. As a result, the adder ALU calculates X=4+0 and the calculation result is stored in the register REG3. Therefore, the main pattern becomes X=4.

Next, the constitution and operation of the sub pattern generating parts 122 to 124 will be explained. Since the sub pattern generating parts 122 to 124 have the same configuration, only one sub pattern generating part 122 will be explained herein. This sub pattern generating part 122 comprises three registers REG2, REG3 and REG4, two multiplexers MUX1 and MUX2, and a masking gate MASK. The main patterns X=0, X=4, X=8, . . . generated by the main pattern generating part 121 are inputted to the multiplexer MUX1. The parameter P1 is inputted to the register REG2 from the sequence control part 110 (FIG. 16). In this examples a case of P1=1 is shown. This parameter P1=1 is stored in the register REG2. (The parameters 2 and 3 are stored in the registers REG2 of the sub pattern generating parts 123 and 124 respectively.) When the main pattern generating part 121 generates a main pattern X=0, the adder ALU calculates X=0+1 and the calculation result X=1 is stored in the register REG3. Therefore, a sub pattern X=1 is outputted to an output terminal TB. Then, when the main pattern generating part 121 generates a main pattern X=4, the adder ALU of the sub pattern generating part 122 calculates X=4+1 and the calculation result is stored in the register REG3. As a result, a sub pattern X=5 is outputted to the output terminal TB. In such a way, in the sub pattern generating parts 122 to 124, the parameters (1, 2, 3) stored in the register REG2 are added to the main pattern signals X=0, X=4, X=8, . . . generated from the main pattern generating part 121 in the respective steps 1, 2, 3, . . . , and pattern signals X=0, X=1, X=2, X=3; X=4, X=5, X=6, X=7; and X=8, X=9, X=10, X=11 arranged in the desired sequence are outputted to the output terminals TA to TD for each of the respective cycles t−1, t, t+1, . . .

Figure 21:
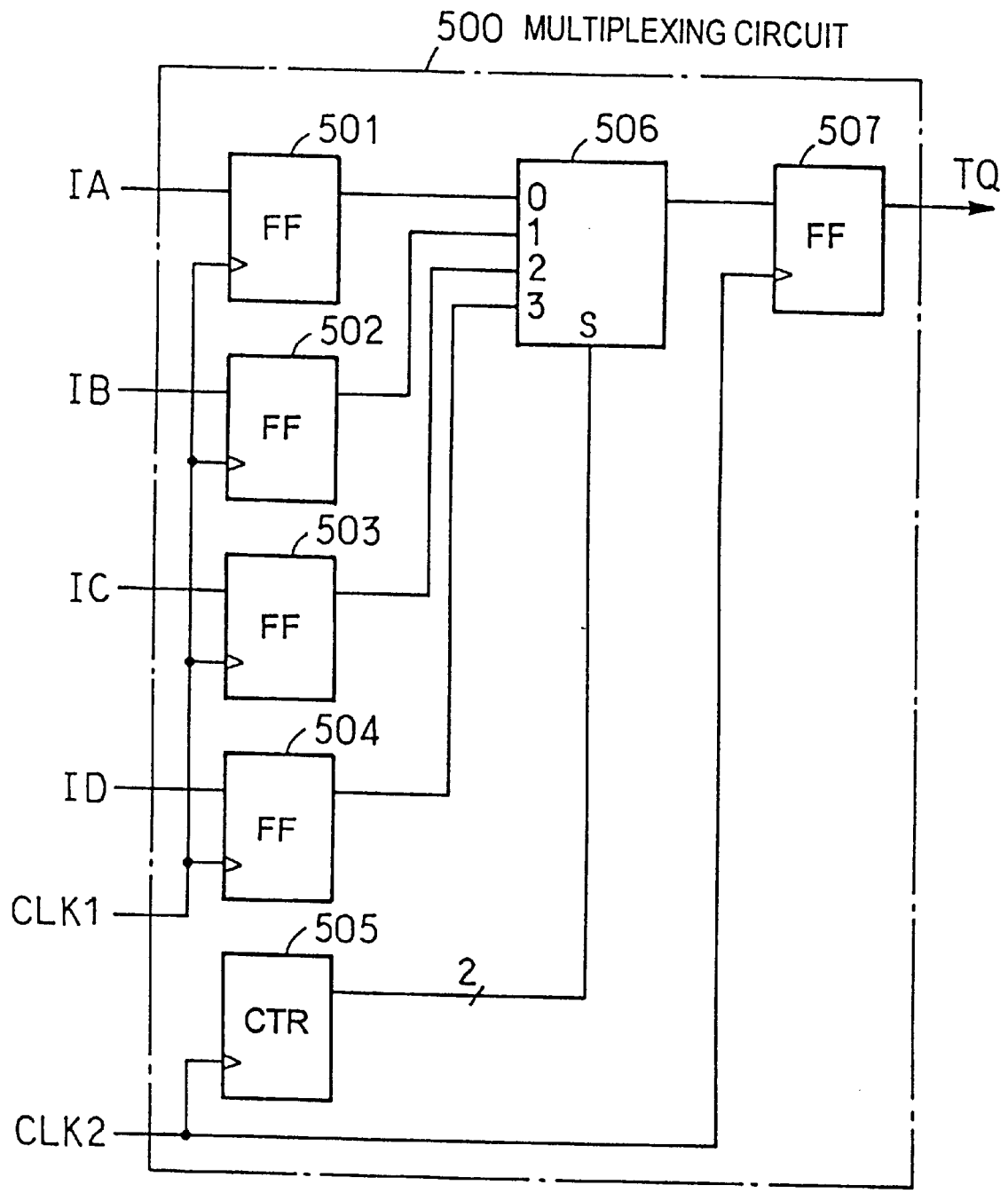
FIG. 21 is a block diagram for explaining a specific example of a multiplexing circuit used in the high speed pattern generator shown in FIG. 15.
Figure 22:
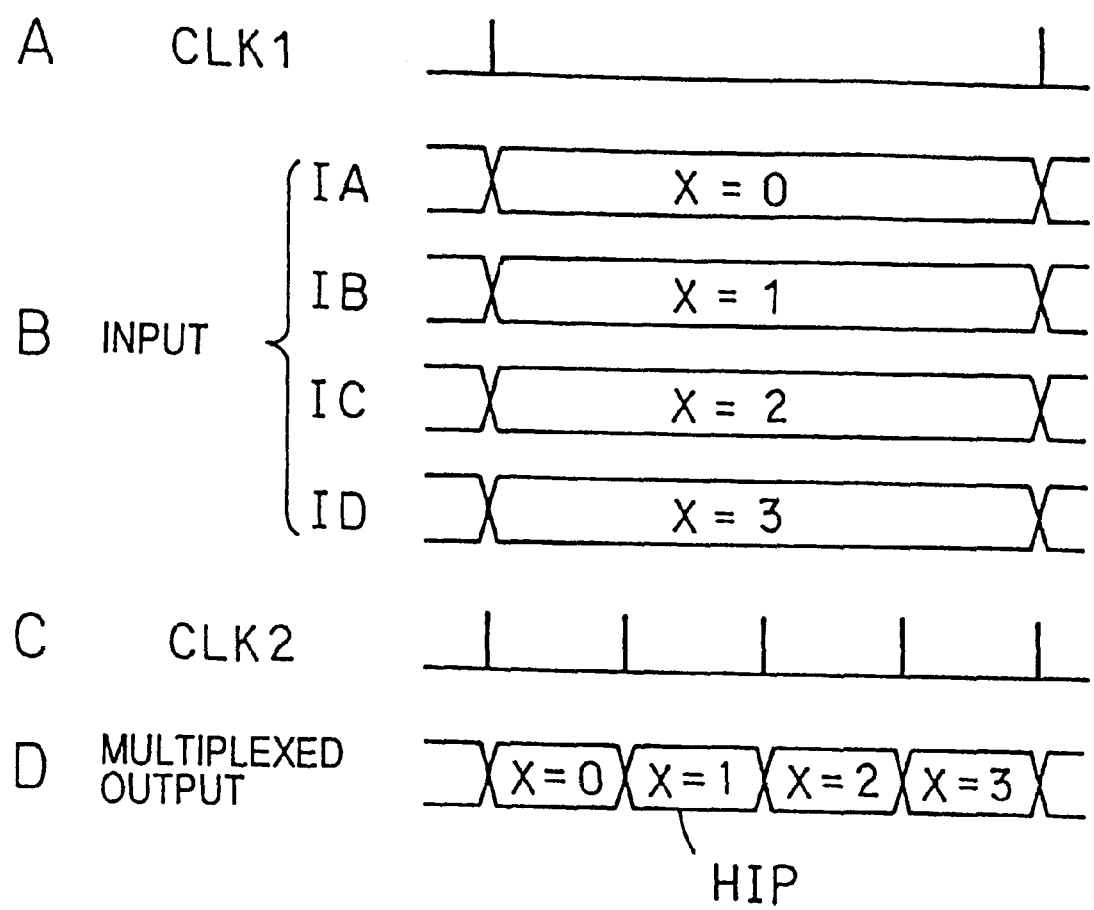
FIG. 22 is a wave form diagram for explaining an operation of the multiplexing circuit shown in FIG. 21.

The patterns outputted from the output terminals TA to TD are inputted to respective input terminals IA to ID of the multiplexing circuit 500 shown in FIG. 21. In the multiplexing circuit 500, flip-flops 501, 502, 503 and 504 are coupled to the input terminals IA, IB, IC and ID, respectively. The patterns, for example, X=0, X=1, X=2 and X=3 generated from the pattern generating part 120 are respectively latched in the flip-flops 501 to 504 by a clock CLK1 shown in FIG. 22A. In a multiplexer 506 which is of a type having four inputs and one output, the latch outputs of the flip-flops 501 to 504 are selected and taken out in the period of a clock CLK2 shown in FIG. 22C. Further, these latch outputs are then time adjusted by a flip-flop 507 and are outputted to an output terminal TQ. A high speed pattern signal HIP having an increased speed by four times, shown in FIG. 22D, is outputted to the output terminal TQ in accordance with the predetermined sequence. Further, a reference numeral 505 shown in FIG. 21 indicates a counter for counting the clock CLK2, and the multiplexer 506 is controlled for its switching by the count output of the counter 505.

As explained above, according to the present invention, while a sequence control part and a pattern generating part operating in the speed equivalent to the conventional operation speed are utilized, a high speed pattern signal having an increased speed in which the conventional operation speed is multiplied by the number of multiplexing can be obtained. Therefore, a high speed operation can be achieved without need of constituting the circuits using elements especially operating at high speed. In addition, since a high speed operation can be achieved without employing a super pipeline structure, there can be provided a high speed pattern generator which is manufactured at low cost and is compact.

Furthermore, a user may create a program (a pattern program) for generating patterns in the manner similar to the conventional way and may not have to create a special program for multiplexing. Consequently, a program for generating a high speed pattern can be easily created.

In addition, according to the high speed pattern generator of the third embodiment of the present invention, even if the sequence control part 110, the pattern generating part 120, and the flip-flops 501 to 504 forming the multiplexing circuit 500 are constituted by circuits operating at a speed equivalent to the conventional operation speed, a high speed pattern signal having an increased speed multiplied by the number of multiplexing in the multiplexer 500 can be generated. Therefore, when, in the multiplexing circuit 500, the number of multiplexing N is selected to be N=4 as in the above embodiment, use of circuits operating at speed of 100 MHz results in generation of a high speed pattern signal having speed of 400 MHz.

In addition, according to the present invention, since arguments (parameters) are added to a main pattern generating instruction and sub patterns to be multiplexed are generated using the arguments, a programmer can create a program by defining only the main pattern. Therefore, there is obtained an advantage that a program for generating high speed patterns can easily be created.

Furthermore, according to the present invention, the apparatus can be manufactured at low cost as the main portions of the sequence control part 110 and the pattern generating part 120, etc. can be composed of circuits equivalent to the conventional circuits. In addition, there is also an advantage that the entire apparatus can be manufactured in compact size because a super multi-stage pipeline structure need not be taken.

What is claimed is:

1. A high speed pattern generator comprising:
    a pattern generator having a sequence control part and a pattern generating part, the sequence control part including an instruction memory and an address converting part, wherein
        the instruction memory is divided into a first instruction memory in which sequence control instructions are stored and a second instruction memory comprising a plurality of sub-pattern generating instruction storage areas in which a plurality of sub-pattern generating instructions are stored respectively;
        an address signal for accessing the first instruction memory is supplied to the second instruction memory via the address converting part; and
        the address converting part is arranged such that when an address value of the address signal for accessing to the first instruction memory is changed toward a value incremented by one, the address converting part supplies the address signal the address value of which has been changed to the second instruction memory, and when an address value of the address signal for accessing to the first instruction memory is changed to a value other than a value incremented by one, the address converting part converts the address signal to a converted address signal having a value in which a predetermined value is added to an address value of such a preceding address signal which is in the immediately preceding cycle of the address signal for accessing to the first instruction memory, and supplies the thus converted address signal to the second instruction memory.

2. The high speed pattern generator according to claim 1 wherein said address converting part comprises:

address delay means for delaying by one cycle the address signal for accessing to said first instruction memory;

selector means for selecting and taking out either one of a delayed address signal delayed by said address delay means and an address signal which does not pass through said delay means; and adding means for adding, when said selector means selects the delayed address signal delayed by said delay means, a predetermined value to the selected delayed address signal.

3. The high speed pattern generator according to claim 2 wherein a control signal of logical "0" is outputted when the address value of the address signal for accessing to said first instruction memory is changed toward a value incremented by one is detected, and a control signal of logical "1" is outputted when the address value of the address signal for accessing to said first instruction memory is changed to a value other than a value incremented by one is detected, said control signal of logical "1" controlling said selector means forming said address converting part so that said selector means selects the delayed address signal outputted from said address delay means, and said adding means adds said control signal of logical "1" to the most significant bit side of the selected delayed address signal to execute an address conversion.

4. The high speed pattern generator according to claim 3, further comprising:

address delay means for delaying by one cycle a converted address outputted from said address converting table; and selector means for selecting either one of a delayed address delayed by said address delay means and an address signal for accessing to said first instruction memory to supply the selected one to said second instruction memory, and wherein said selector means supplies, when an address value of the address signal for accessing to said first instruction memory is changed toward a value incremented by one, the address signal the address value of which has been changed to said second instruction memory, and supplies, when an address value of said first instruction memory is changed to a value other than a value incremented by one, a delayed address signal delayed by said address delay means to said second instruction memory.

5. The high speed pattern generator according to claim 4, further comprising a control logic circuit for controlling said selector means, when detects that a value of the address signal for accessing to said first instruction memory is changed toward a value incremented by one, so that said selector means selects the address signal for accessing to said first instruction memory and supplies the selected address signal to said second instruction memory, and for controlling said selector means, when detects that a value of the address signal for accessing to said first instruction memory is changed to a value other than a value incremented by one, so that said selector means selects the converted address outputted from said address converting table and supplies the selected converted address to said first instruction memory.

6. A high speed pattern generating method for generating test pattern signals at high speed from a pattern generator which comprises a sequence control part and a pattern generating part and generates a test pattern signal from said pattern generating part in accordance with a pattern generating instruction read out from an instruction memory provided in said sequence control part, said test pattern signal being applied to a device under test for testing the operation thereof, said method comprising the steps of:

providing N sub-pattern generating instruction storage areas for storing N sub-pattern generating instructions in said instruction memory, which is provided in said sequence control part, where N is an integer greater than or equal to 2;

supplying said N-sub-pattern generating instructions read out from said N sub-pattern generating instruction storage areas to N sub-pattern generating part which are provided in said N sub-pattern generating part to receive corresponding one of the respective N sub-pattern generating instructions thus supplied thereto, respectively;

generating a multi-N-phase pattern signal comprising the N sub-pattern signals having different phases generated from said N sub-pattern generating parts in accordance with the N sub-pattern generating instructions supplied thereto, respectively, said multi-N-phase pattern signal being distributed in phases and in the sequence to be applied to said device under test; and time division multiplexing by 1/N said multi-N-phase pattern signal using a multiplexing circuit thereby generating the high speed pattern signal having an increased speed multiplexed by N, wherein said instruction memory is divided into a first instruction memory in which sequence control instructions and an address converting table are stored, and a second instruction memory comprising a plurality of pattern generating instruction storage areas and said address converting table converts, when an address value of the address signal for accessing to said first instruction memory is changed toward a value other than a value incremented by one in accordance with a sequence control instruction, the address value of said first instruction memory into which that sequence control instruction is stored into an address value sequentially decremented by one from the last address of said second instruction memory and outputs the converted address signal, and supplies, when and address value of the address signal for accessing to said first instruction memory is changed toward a value incremented by one, the address signal as it is to said second instruction memory, and supplies, when an address value of the address signal for accessing to said first instruction memory is changed to a value other than a value incremented by one, the converted address outputted from said address converting table to said second instruction memory.

7. A high speed pattern generating method for generating test pattern signals at high speed, being characterized by the steps of:

outputting from an instruction memory a pattern generating instruction having an argument for prescribing a plurality of sub patterns following a main pattern;

generating a main pattern from a main pattern generating part in accordance with the pattern generating instruction;

supplying said main pattern generated from said main pattern generating part to a plurality of sub pattern generating parts;

changing said main pattern in said plurality of sub pattern generating parts in accordance with said arguments;

delaying said main pattern thereby to generate a plurality of sub patterns subsequent to said main pattern in the same phase as that of said main pattern; and time division multiplexing said main pattern and said plurality of sub patterns in a multiplexing circuit, and taking out the time division multiplexed patterns so that high speed patterns changing in accordance with a predetermined pattern generation sequence are generated.

8. A high speed pattern generator used in a semiconductor device testing apparatus for testing the operation of a device under test by generating a test pattern signal from a pattern generating part in accordance with pattern generating instructions read out from an instruction memory provided in a sequence control part and by applying the test pattern signal to the device under test, said high speed pattern generator being characterized in that:

a main pattern generating instruction for generating a main pattern and arguments for prescribing a plurality of patterns to be generated in a predetermined sequence subsequent to the main pattern are read out from said instruction memory;

the main pattern is generated from said main pattern generating part in accordance with said read out main pattern generating instruction;

the main pattern generated from said main pattern generating part is supplied to a plurality of sub pattern generating parts;

a plurality of sub patterns corresponding to the plurality of patterns to be generated in the predetermined sequence subsequent to the main pattern are generated in accordance with said arguments in said plurality of sub pattern generating parts; and said plurality of sub patterns and said main pattern are time division multiplexed in a multiplexing circuit so that high speed patterns having an increased speed in which the number of multiplexing in said multiplexing circuit is multiplied by the speed of reading out said pattern generating instructions are generated.

9. The high speed pattern generator according to claim 8, being characterized in that the main pattern generated from said main pattern generating part is delayed by an amount of delay time equivalent to that in said sub pattern generating parts so that the phase of said main pattern and the phases of the sub patterns generated from said plurality of sub pattern generating parts are matched by this delay operation, and said main pattern and said sub patterns the phases of which are matched with one another are supplied to said multiplexing circuit.

10. A high speed pattern generator comprising:

a sequence control part; and a pattern generating part, wherein said sequence control part comprises:

an instruction memory which comprises a first instruction memory storing sequence control instructions and a second instruction memory having N sub-pattern generating instruction storage areas storing N sub-pattern generating instructions, where N is an integer greater than or equal to 2;

a program counter generating an address signal accessing said first instruction memory; and an address converting part supplied with the address signal from said program counter and supplying a converted address signal to said second instruction memory;

said address converting part being arranged such that when an address value of the address signal accessing said first instruction memory is changed to a value incremented by one, said address converting part supplies the address signal, the address value of which has been changed to said second instruction memory, and when an address value of the address signal accessing said first instruction memory is changed to a value other than a value incremented by one, said address converting part converts the address signal to an address signal having a value in which a predetermined value is added to an address in an immediately preceding cycle of the address signal accessing said first instruction memory, and supplies the converted address signal to said second instruction memory.

11. The high speed pattern generator according to claim 10, wherein said address converting part comprises:

address delay means for delaying by one cycle the address signal for accessing said first instruction memory;

selector means for selecting and taking out either one of a delayed address signal delayed by said address delay means and an address signal which does not pass through said delay means; and adding means for adding, when said selector means selects the delayed address signal delayed by said delay means, a predetermined value to the selected delayed address signal.

12. The high speed pattern generator according to claim 11, further comprising a control logic circuit which detects the address value of the address signal and outputs a control signal of logical "Y" when the address value is a value incremented by one, and a control signal of logical "1" when the address value is a value other than the value incremented by one, wherein said selector means selects the delayed address signal output from said address delay means when said control signal of logical "1" is supplied thereto, and said adding means adds said control signal of logical "V" to a most significant bit side of the selected delayed address signal to execute an address conversion.

13. The high speed pattern generator according to claim 12, further comprising:

address delay means for delaying by one cycle a converted address signal output in accordance with said address converting table; and selector means for selecting either one of the delayed converted address signal delayed by said address delay means and an address signal for accessing said first instruction memory to supply the selected one to said second instruction memory, wherein said selector means supplies, when an address value of the address signal for accessing said first instruction memory is changed to a value incremented by one, the address signal, the address value of which has been changed to said second instruction memory, and supplies, when an address value of said first instruction memory is changed to a value other than a value incremented by one, the delayed converted address signal delayed by said address delay means to said second instruction memory.

14. A high speed pattern generator comprising:

a sequence control part;

a pattern generating part; and a multiplexing circuit, wherein said sequence control part comprises:
  a first instruction memory having a sequence control instruction storage area storing sequence control instructions and an address converting table storage area storing an address converting table,
  a second instruction memory having N sub-pattern generating instruction storage areas storing respective one of sub-pattern generating instructions, respectively, where N is an integer greater than or equal to 2, and
  a selector, wherein
    said address converting table storage area of said first instruction memory converts in accordance with said address converting table, when an address value of the address signal for accessing said first instruction memory is changed to a value other than a value incremented by one, which change is caused by a sequence control instruction, the address value of said address signal for said first instruction memory which corresponds to the address in which said sequence control instruction is stored into a converted address signal which has an address value with sequential decrement by one from a last address of said second instruction memory, and outputs the converted address signal, and
    said selector supplies, when an address value of the address signal for accessing said first instruction memory is changed to a value incremented by one, the address signal for the first instruction memory to said second instruction memory, and supplies, when the change in the address value of the address signal for accessing said first instruction memory is changed to a value other than a value incremented by one, the converted address signal output from said address converting table storage area to said second instruction memory.

15. The high speed pattern generator according to claim 14, further comprising a control logic circuit controlling said selector means, when it is detected that a value of the address signal for accessing said first instruction memory is changed to a value incremented by one, so that said selector means selects the address signal for accessing said first instruction memory and supplies the selected address signal to said second instruction memory, and controlling said selector means, when it is detected that a value of the address signal for accessing said first instruction memory is changed to a value other than a value incremented by one, so that said selector means selects the converted address signal output from said address converting table and supplies the selected converted address signal to said first instruction memory.

16. A high speed pattern generating method comprising the steps of:
  outputting from an instruction memory a main pattern generating instruction and N arguments for prescribing N sub-patterns which are to be generated subsequent to the main pattern, respectively, where N is an integer greater than or equal to 2;
  generating a main pattern by a main pattern generating part in accordance with the main pattern generating instruction;
  supplying said main pattern generated from said main pattern generating part to N sub-pattern generating parts, respectively;
  supplying respective one of said N arguments from said instruction memory to corresponding one of said N sub-pattern generating parts, respectively;
  generating N sub-patterns by the N sub-pattern generating parts by changing said main pattern in accordance with the argument supplied thereto, respectively;
  delaying said main pattern to match a main pattern phase with the phases of said N sub-patterns, which are generated to be subsequent to said main pattern; and
  time division multiplexing by 1/N said main pattern and said N sub-patterns in a multiplexing circuit; and
  removing the time division multiplexed patterns as an output pattern signal changing in accordance with a predetermined pattern generation sequence with an increased speed multiplexed by N.

17. A high speed pattern generator comprising:

a sequence control part;

a pattern generating part; and a multiplexing circuit, wherein
  said sequence control part includes an instruction memory storing a main pattern generating instruction generating a main pattern and arguments prescribing N sub-patterns to be generated in a predetermined sequence subsequent to the main pattern, where N is an integer greater than or equal to 2,
  said pattern generating part comprises a main pattern generating part generating a main pattern in accordance with the main pattern generating instructions read out from the instruction memory and N sub-pattern generating parts supplied corresponding to one of the respective arguments, respectively,
  each of said N sub-pattern generating parts is further supplied with the main pattern generated by said main pattern generating part so that N sub-patterns corresponding to the plurality of patterns to be generated in the predetermined sequence subsequent to the main pattern are generated in accordance with said arguments by said N sub-pattern generating parts, and
  said multiplexing circuit performs time division multiplexing by 1/N onto said N sub-patterns and said main pattern so that high speed patterns having an increased speed multiplied by N are generated.

18. The high speed pattern generator according to claim 17, wherein said pattern generating part further comprises a pattern delay circuit delaying the main pattern generated from said main pattern generating part by an amount of delay time equivalent to that in said sub-pattern generating parts so that a phase of said main pattern and phases of the N sub-patterns generated from said N sub-pattern generating parts are matched by the delay operation and said main pattern and said sub-patterns, the phases of which are matched with one another, are supplied to said multiplexing circuit.

19. A high speed pattern generator comprising:

a sequence control part which includes,
  an instruction memory,
  a program counter supplying an address signal to said instruction memory, and an address converting part;

a pattern generating part; and a multiplexing part;

said instruction memory comprising:

a first instruction memory having a sequence control instruction storage area storing sequence control instructions; and a second instruction memory having N sub-pattern generating instruction storage areas, where N is an integer equal to or greater than 2, storing N-phase sub-pattern generating instructions capable of providing N-phase sub-patterns; and said first instruction memory is accessed with an address signal supplied thereto from the program counter deriving a sequence control instruction so that the read out sequence control instruction determines an address to be accessed next in the instruction memory, said second instruction memory is accessed with an address signal supplied thereto from the program counter controlling a readout sequence of the N-phase sub-pattern generating instructions from said N sub-pattern generating instruction storage areas, said address converting part receiving the address signals from said program counter is arranged such that when an address value of one address signal supplied thereto has a value incremented by one from that of a previous one address signal supplied thereto in an immediately preceding one access cycle, said address converting part supplies said one address signal supplied thereto to said second instruction memory, and when an address value of one address signal supplied thereto has a value other than the value incremented by one from that of a previous one address signal supplied thereto in immediately preceding one access cycle, said address converting part converts said previous one address signal into a converted address signal by adding thereto a predetermined value and supplies the converted address signal to said second instruction memory.

20. The high speed pattern generator according to claim 19, wherein said pattern generating part comprises:

N-phase sub-pattern generating parts which are supplied with N-phase sub-pattern generating instructions and generate N-phase sub-patterns.

21. The high speed pattern generator according to claim 20, wherein said multiplexing part comprises:

N flip-flop circuits, to which the N-phase sub-patterns are coincidentally input from said N-phase sub-pattern generating parts, respectively, and which takes therein the supplied N-phase sub-patterns in a period of a first clock which is used for reading out of the sub-pattern generating instructions from the sub-pattern generating instruction storage areas; and a multiplexer, to which the thus taken N-phase sub-patterns are input from the N flip-flop circuits, and which sequentially switches said N-phase sub-patterns in response to a second clock having a period of 1/N of that of said first clock, to thereby obtain a high speed pattern signal having an increased frequency multiplied by N than that of the first clock.

22. The high speed pattern generator according to claim 19, wherein said address converting part comprises:

an address delay unit delaying by one cycle the address signal to be supplied from said program counter to said first instruction memory and outputting a previous address signal;

a selector unit selecting and taking out either one of a delayed address signal delayed by said address delay means and an address signal which does not pass through said delay means; and adding means for adding, when said selector means selects the delayed address signal delayed by said delay means, a predetermined value to the selected delayed address signal.

* * * * *

UNITED STATES PATENT AND TRADEMARK OFFICE
CERTIFICATE OF CORRECTION

PATENT NO. : 6,006,349
DATED : December 21, 1999
INVENTOR(S) : Kenichi FUJISAKI

It is certified that error appears in the above-identified patent and that said Letters Patent is hereby corrected as shown below:

Column 4, line 66, change "or" to -- of --.

Column 6, line 38, change "croup" to -- group --.

Column 10, line 7, change "wnich" to -- which --.

Column 14, line 52, change "pars" to -- part --.

Signed and Sealed this

Twenty-sixth Day of September, 2000

Q. TODD DICKINSON

Attest:

Attesting Officer

Director of Patents and Trademarks